US008980756B2

(12) United States Patent
Tran et al.

(10) Patent No.: US 8,980,756 B2
(45) Date of Patent: Mar. 17, 2015

(54) METHODS FOR DEVICE FABRICATION USING PITCH REDUCTION

(75) Inventors: Luan C. Tran, Meridian, ID (US); Raghupathy Giridhar, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 1758 days.

(21) Appl. No.: 11/830,449

(22) Filed: Jul. 30, 2007

(65) Prior Publication Data

US 2009/0035584 A1    Feb. 5, 2009

(51) Int. Cl.
| | | |
|---|---|---|
| H01L 21/461 | (2006.01) | |
| H01L 21/3213 | (2006.01) | |
| H01L 21/033 | (2006.01) | |
| H01L 27/105 | (2006.01) | |

(52) U.S. Cl.
CPC ...... *H01L 21/32139* (2013.01); *H01L 21/0337* (2013.01); *H01L 21/0338* (2013.01); *H01L 27/105* (2013.01); *H01L 27/1052* (2013.01)
USPC ............................ 438/703; 438/734; 438/735

(58) Field of Classification Search
None
See application file for complete search history.

(56) References Cited

U.S. PATENT DOCUMENTS

| | | | |
|---|---|---|---|
| 4,091,406 A * | 5/1978 | Lewis ........................... 257/639 |
| 5,328,810 A | 7/1994 | Lowrey et al. | |
| 5,618,383 A * | 4/1997 | Randall ......................... 430/314 |
| 6,297,129 B2 | 10/2001 | Tran et al. | |
| 6,573,030 B1 | 6/2003 | Fairbairrn et al. | |
| 6,607,944 B1 | 8/2003 | Tran et al. | |
| 6,638,441 B2 * | 10/2003 | Chang et al. ..................... 216/46 |
| 6,933,207 B2 | 8/2005 | Tran et al. | |
| 6,955,961 B1 * | 10/2005 | Chung ........................... 438/241 |
| 7,045,834 B2 | 5/2006 | Tran et al. | |
| 7,115,525 B2 | 10/2006 | Abatchev et al. | |
| 7,151,040 B2 * | 12/2006 | Tran et al. ...................... 438/401 |
| 7,253,118 B2 * | 8/2007 | Tran et al. ...................... 438/717 |
| 7,268,054 B2 * | 9/2007 | Tran et al. ...................... 438/401 |
| 7,361,569 B2 * | 4/2008 | Tran et al. ...................... 438/401 |
| 7,368,362 B2 * | 5/2008 | Tran et al. ...................... 438/401 |
| 7,390,746 B2 * | 6/2008 | Bai et al. ........................ 438/689 |
| 7,393,789 B2 * | 7/2008 | Abatchev et al. ............. 438/692 |
| 7,396,781 B2 * | 7/2008 | Wells ............................. 438/448 |
| 7,429,536 B2 * | 9/2008 | Abatchev et al. ............. 438/725 |
| 7,455,956 B2 * | 11/2008 | Sandhu et al. ................ 430/313 |
| 7,473,647 B2 * | 1/2009 | Lee et al. ....................... 438/706 |
| 7,488,685 B2 * | 2/2009 | Kewley .......................... 438/689 |
| 7,547,640 B2 * | 6/2009 | Abatchev et al. ............. 438/736 |
| 7,560,390 B2 * | 7/2009 | Sant et al. ...................... 438/717 |
| 7,563,712 B2 * | 7/2009 | Jung .............................. 438/671 |
| 7,576,010 B2 * | 8/2009 | Lee et al. ....................... 438/717 |

(Continued)

OTHER PUBLICATIONS

PCT International Search Report for application No. PCT/US2008/070407, dated Feb. 11, 2009, 3 pages.

(Continued)

*Primary Examiner* — David E Graybill
(74) *Attorney, Agent, or Firm* — TraskBritt

(57) ABSTRACT

Embodiments of a method for device fabrication by reverse pitch reduction flow include forming a first pattern of features above a substrate and forming a second pattern of pitch-multiplied spacers subsequent to forming the first pattern of features. In embodiments of the invention the first pattern of features may be formed by photolithography and the second pattern of pitch-multiplied spacers may be formed by pitch multiplication. Other methods for device fabrication are provided.

25 Claims, 13 Drawing Sheets

(56) References Cited

U.S. PATENT DOCUMENTS

| | | | |
|---|---|---|---|
| 7,579,278 B2* | 8/2009 | Sandhu | 438/689 |
| 7,611,944 B2* | 11/2009 | Tran et al. | 438/241 |
| 7,611,980 B2* | 11/2009 | Wells et al. | 438/597 |
| 7,629,693 B2* | 12/2009 | Abatchev et al. | 257/775 |
| 7,651,951 B2* | 1/2010 | Tran et al. | 438/738 |
| 7,655,387 B2* | 2/2010 | Sandhu et al. | 430/314 |
| 7,666,578 B2* | 2/2010 | Fischer et al. | 430/314 |
| 7,687,408 B2* | 3/2010 | Abatchev et al. | 438/751 |
| 7,718,540 B2* | 5/2010 | Tran et al. | 438/717 |
| 7,732,343 B2* | 6/2010 | Niroomand et al. | 438/725 |
| 2001/0013612 A1 | 8/2001 | Tran et al. | |
| 2003/0001182 A1 | 1/2003 | Tran et al. | |
| 2005/0161721 A1 | 7/2005 | Iyer et al. | |
| 2006/0046201 A1* | 3/2006 | Sandhu et al. | 430/314 |
| 2006/0046407 A1* | 3/2006 | Juengling | 438/301 |
| 2006/0046422 A1 | 3/2006 | Tran et al. | |
| 2006/0046483 A1 | 3/2006 | Abatchev et al. | |
| 2006/0046484 A1* | 3/2006 | Abatchev et al. | 438/689 |
| 2006/0208282 A1 | 9/2006 | Tran et al. | |
| 2006/0211260 A1 | 9/2006 | Tran et al. | |
| 2006/0216922 A1* | 9/2006 | Tran et al. | 438/618 |
| 2006/0216923 A1* | 9/2006 | Tran et al. | 438/622 |
| 2006/0228854 A1* | 10/2006 | Tran et al. | 438/238 |
| 2006/0240362 A1* | 10/2006 | Sandhu et al. | 430/313 |
| 2006/0258109 A1* | 11/2006 | Juengling | 438/301 |
| 2006/0258162 A1* | 11/2006 | Abatchev et al. | 438/725 |
| 2006/0262511 A1 | 11/2006 | Abatchev et al. | |
| 2006/0263699 A1* | 11/2006 | Abatchev et al. | 430/5 |
| 2006/0264000 A1* | 11/2006 | Tran et al. | 438/401 |
| 2006/0264001 A1* | 11/2006 | Tran et al. | 438/401 |
| 2006/0264002 A1* | 11/2006 | Tran et al. | 438/401 |
| 2006/0273456 A1 | 12/2006 | Sant et al. | |
| 2006/0281266 A1* | 12/2006 | Wells | 438/299 |
| 2007/0045712 A1* | 3/2007 | Haller et al. | 257/315 |
| 2007/0048674 A1* | 3/2007 | Wells | 430/313 |
| 2007/0049011 A1* | 3/2007 | Tran | 438/637 |
| 2007/0049030 A1* | 3/2007 | Sandhu et al. | 438/689 |
| 2007/0049032 A1* | 3/2007 | Abatchev et al. | 438/691 |
| 2007/0049035 A1* | 3/2007 | Tran | 438/696 |
| 2007/0049040 A1* | 3/2007 | Bai et al. | 438/712 |
| 2007/0117310 A1* | 5/2007 | Bai et al. | 438/242 |
| 2007/0128856 A1* | 6/2007 | Tran et al. | 438/637 |
| 2007/0138526 A1* | 6/2007 | Tran et al. | 257/296 |
| 2007/0148984 A1 | 6/2007 | Abatchev et al. | |
| 2007/0161251 A1* | 7/2007 | Tran et al. | 438/725 |
| 2007/0190463 A1* | 8/2007 | Sandhu et al. | 430/311 |
| 2007/0238299 A1* | 10/2007 | Niroomand et al. | 438/700 |
| 2007/0238308 A1* | 10/2007 | Niroomand et al. | 438/743 |
| 2007/0249170 A1* | 10/2007 | Kewley | 438/706 |
| 2007/0261016 A1* | 11/2007 | Sandhu et al. | 716/19 |
| 2007/0264830 A1* | 11/2007 | Huang et al. | 438/694 |
| 2007/0281219 A1* | 12/2007 | Sandhu | 430/5 |
| 2008/0014533 A1* | 1/2008 | Keller et al. | 430/311 |
| 2008/0070165 A1* | 3/2008 | Fischer et al. | 430/314 |
| 2008/0085612 A1* | 4/2008 | Smythe et al. | 438/787 |
| 2008/0162781 A1* | 7/2008 | Haller et al. | 711/101 |
| 2008/0176406 A1* | 7/2008 | Ikeda et al. | 438/703 |
| 2008/0280212 A9* | 11/2008 | Kumar | 430/5 |
| 2009/0035584 A1* | 2/2009 | Tran et al. | 428/446 |
| 2009/0053892 A1* | 2/2009 | Meyer et al. | 438/667 |

OTHER PUBLICATIONS

PCT Written Opinion for application No. PCT/US2008/070407, dated Feb. 11, 2009, 4 pages.

U.S. Appl. No. 60/666,031, filed Mar. 28, 2005.

* cited by examiner

METHODS FOR DEVICE FABRICATION USING PITCH REDUCTION

FIELD OF INVENTION

Embodiments of the invention relate generally to integrated circuit device fabrication and, more particularly, to patterning techniques utilizing pitch reduction to fabricate a portion of the device, and associated structures.

BACKGROUND

As a consequence of many factors, including demand for increased portability, computing power, memory capacity and energy efficiency, electronic devices such as integrated devices, are continuously being reduced in size. The sizes of the constituent features that form the devices, e.g., electrical elements and interconnect lines, are also constantly being decreased to facilitate this size reduction.

The trend of decreasing feature size is evident, for example, in memory devices or devices such as dynamic random access memories (DRAM), Flash memory, static random access memories (SRAM), ferroelectric (FE) memories, etc. To take one example, DRAM may comprise thousands to billions of identical device components in the form of memory cells. By decreasing the sizes of the electrical device structures that comprise a memory cell and the widths and lengths of the conducting lines to access the memory cells, the memory devices can be made smaller. Additionally, storage capacities can be increased by fitting more memory cells on a given area in the memory devices.

The continual reduction in feature sizes places ever greater demands on the techniques used to form the features. For example, photolithography is commonly used to pattern features, such as conductive lines and pads. The concept of pitch can be used to describe the sizes of these features. Pitch may be defined as the distance between identical points in two neighboring features. These features are typically defined by spaces between adjacent features, which spaces are typically filled by a material, such as an insulator. As a result, pitch can be viewed as the sum of the width of a feature and of the width of the space on one side of the feature separating that feature from a neighboring feature. However, due to factors such as limitations of optics and usable light or other radiation wavelengths, photolithography techniques each have a minimum achievable pitch, below which a particular photolithographic technique cannot reliably form features. Thus, the minimum pitch of a photolithographic technique is an obstacle to continued feature size reduction.

"Pitch doubling" or "pitch multiplication" is one method for extending the capabilities of photolithographic techniques beyond their minimum pitch. One pitch multiplication method is illustrated in FIGS. 1A-1F hereof and described in U.S. Pat. No. 5,328,810, issued to Lowrey et al., the entire disclosure of which is incorporated herein by reference. With reference to FIG. 1A, a pattern of lines 10 is photolithographically formed in a photo definable layer, such as a photoresist, which overlies a layer 20 of an expendable material, which in turn overlies a substrate 30. As shown in FIG. 1B, the pattern is then transferred using an anisotropic etch to the layer 20 to form placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60, i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

Because the layer 50 of spacer material typically has a single thickness 90 (see FIGS. 1D and 1E) and because the sizes of the features formed by the spacers 60 usually correspond to that thickness 90, pitch doubling typically produces features of only one width. Devices, however, generally employ features of different sizes. For example, random access memory devices typically contain arrays of memory cells located in one, more central region of the active surface of the devices and logic devices located in the outer, so-called "peripheral" regions. In the arrays, the memory cells are connected by conductive lines and, in the periphery, the conductive lines contact landing pads for connecting arrays to logic. Peripheral features such as landing pads, however, may be larger than the conductive lines. In addition, periphery electrical devices, including peripheral transistors, may be larger than the electrical devices in the array. Moreover, even if peripheral features can be formed with the same pitch as features in the array, because mask patterns formed by pitch multiplication may be limited to those that are formed along the sidewalls of patterned photoresist, pitch multiplication by itself typically does not offer the flexibility, e.g., geometric flexibility, required to define some features, particularly when features vary in size above and below the pitch resolution of the photolithographic technique used.

To overcome such limitations, some proposed methods for forming patterns at the periphery and in the array involve separately etching patterns into the array region and then peripheral region of a substrate. A pattern in the array region is first formed and transferred to the substrate or intermediate hard mask layer using one mask and then another pattern in the periphery region is formed and separately transferred to the substrate using another mask. Because such methods require forming the pattern in the array region first before forming the other pattern in the periphery region in order to thereafter transfer the patterns to the same level to be subsequently transferred to a substrate, such methods are limited in their ability to form equivalent or higher quality patterns suitable for forming the conductive lines of the array without additional masking and etching steps required for forming the pattern for the periphery features if the away pattern is to be adequately protected. One limitation affecting the quality of the array pattern is defects. Defects may be caused, for example, by the photoresist material deposited between spacers so that features of a larger size may be formed in the periphery. Undesirably, the process conventionally used to form smaller, dimensionally critical, spacers in the pattern of the array while the other larger features in the pattern of the periphery are formed adds expense to the process flow without reducing defect potential in the array.

In addition to problems encountered in forming differently sized features on an integrated circuit device, it has been found that conventional pitch-doubling techniques may experience difficulty transferring a pattern of spacers to a substrate. In conventional methods of transferring the pattern, both the spacers and the underlying substrate layer or layers are exposed to an etchant. The etchants, however, may also etch the material of the spacers, albeit at a slower rate. Thus, over the course of subsequently forming another pattern of features in a peripheral region of the same substrate and then transferring the patterns to an underlying material, the etchant used to form the pattern of features in the peripheral region may remove an unacceptable amount of the material of the spacers before the pattern transfer is completed in both central and peripheral regions.

Also, a layer of material overlaid on the spacers while the features in the peripheral region are formed may leave residual material between adjacent spacers which may potentially cause defects or shorts therein which are subsequently transferred to one or more underlying layers. These difficulties are exacerbated by the trend towards decreasing feature size, which, for example, leads to the need to form trenches which have increasingly higher depth to width, or "aspect" ratios, increasing the potential for defects when subjected to additional steps in the process flow in order to obtain features of various sizes. Thus, in conjunction with difficulties in producing structures having different feature sizes, pattern transfer limitations make the application of pitch multiplication principles to integrated circuit device manufacture even more difficult.

Accordingly, it would be desirable to provide enhanced methods of forming features of different sizes on semiconductor device structures, especially where some features are formed below the minimum size achievable using photolithographic and other conventional lithography techniques, and in conjunction with pitch multiplication.

BRIEF DESCRIPTION OF TH DRAWINGS

DETAILED DESCRIPTION OF THE INVENTION

According to an embodiment of the invention, a method for semiconductor device fabrication by what may be termed "reverse pitch reduction flow" includes patterning a first pattern of features above a substrate and patterning a second pattern of pitch-multiplied spacers subsequent to patterning the first pattern of features. In embodiments of the invention, the first pattern of features may be formed using conventional lithography and the second pattern of pitch-multiplied spacers may be formed by a pitch multiplication technique. Embodiments of the invention also encompass structures associated with the methods disclosed.

Embodiments of the invention may have particular utility in fabrication of NAND Flash devices, wherein the first pattern of features may comprise gates in a peripheral region of the device and the second pattern of features may comprise word lines in a central region thereof. Embodiments of the invention may also be employed in fabrication of DRAM memory, phase change memory and programmable gate array (PGA) devices.

Reference will now be made to the Figures, wherein like numerals refer to like features and elements throughout. It will be appreciated that these Figures are not necessarily drawn to scale.

In embodiments of the invention, a sequence of material layers is formed that allows formation of a mask for processing a substrate.

Figure 1A:
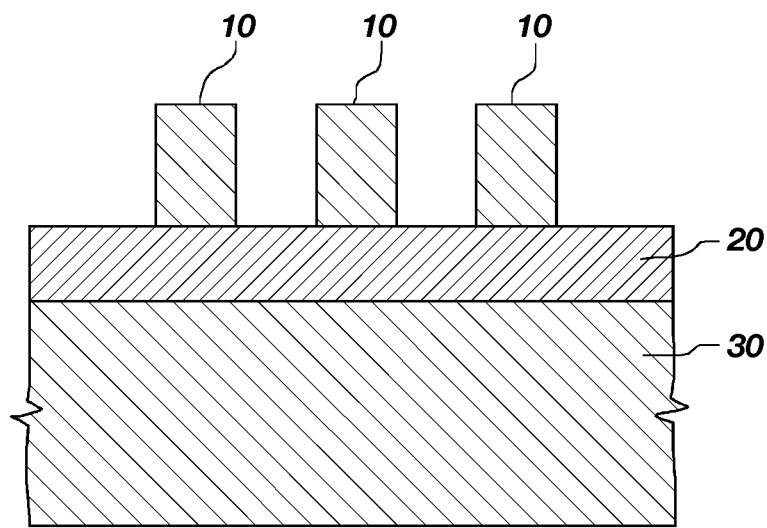
FIGS. 1A-1F show cross-sectional side views of a sequence of masking patterns for forming conductive lines in accordance with a conventional pitch doubling method.
Figure 1B:
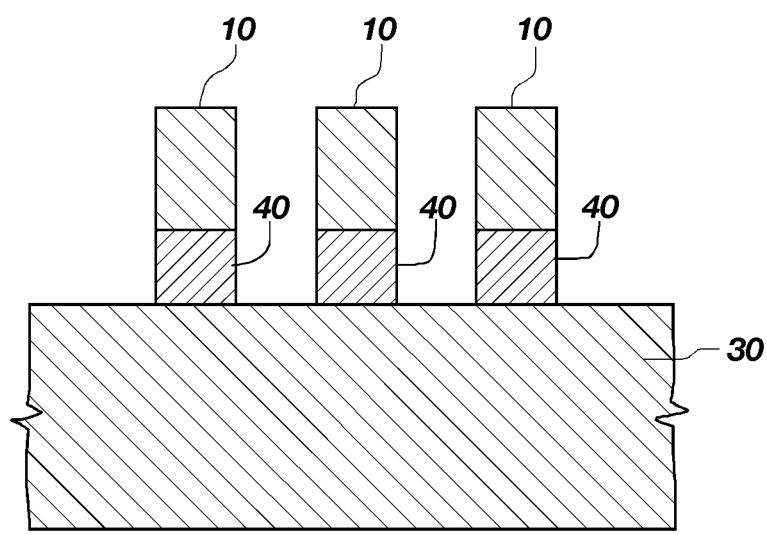
Figure 1C:
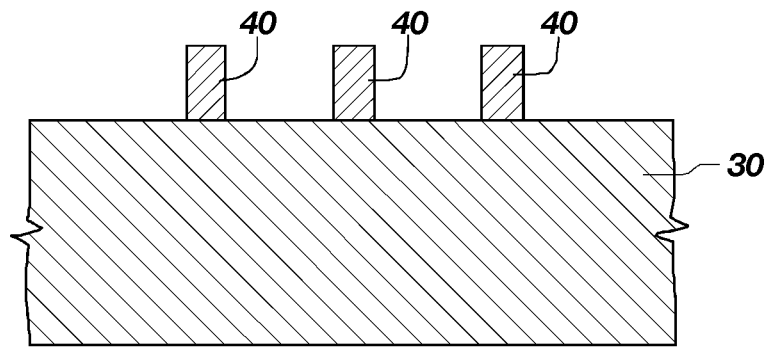
Figure 1D:
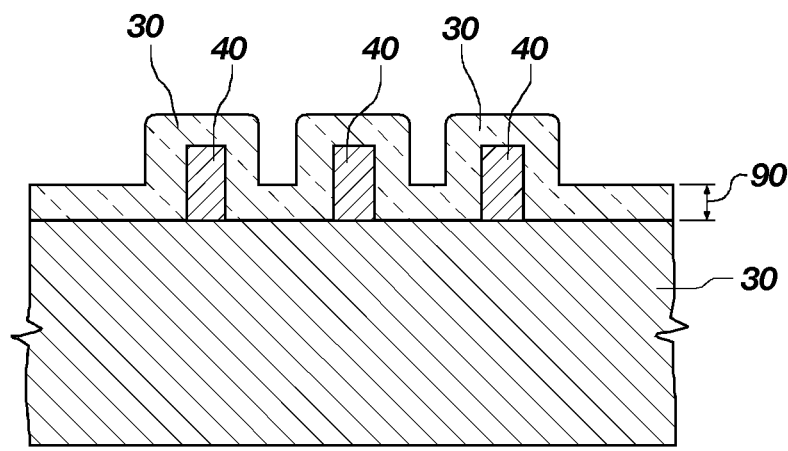
Figure 1E:
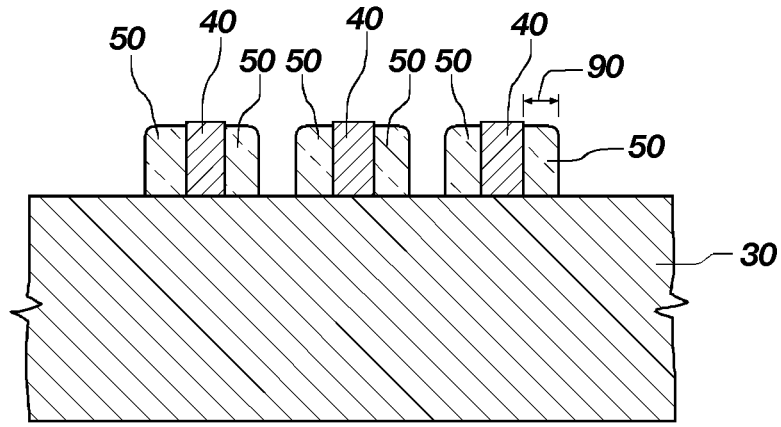
Figure 1F:
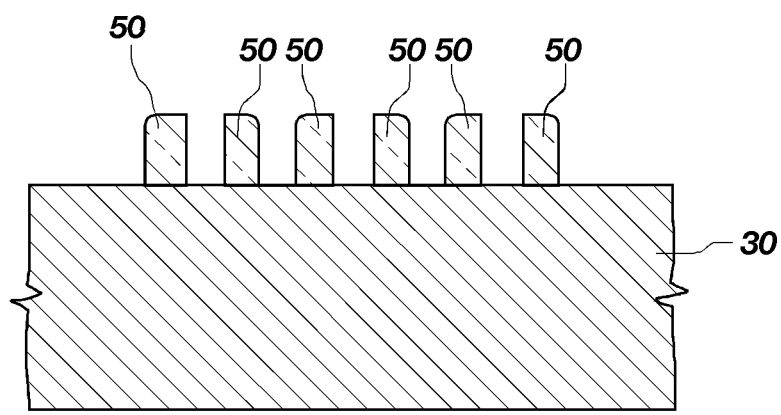
Figure 2:
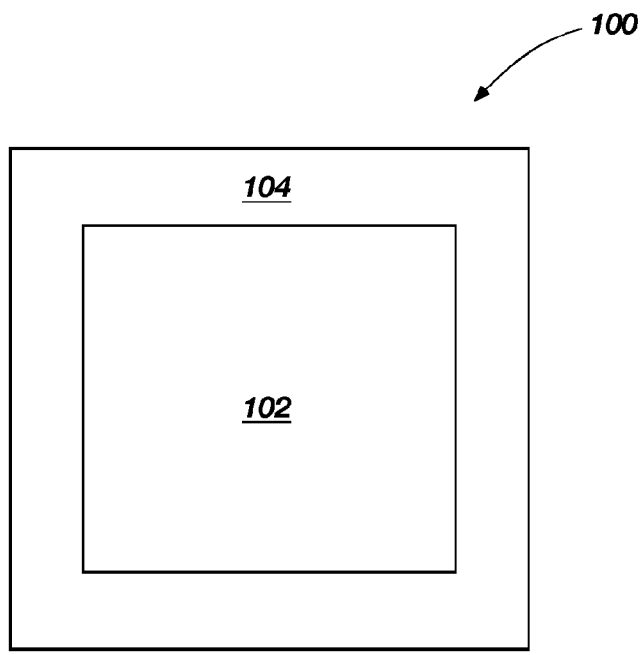
FIG. 2 shows a schematic top view of a partially formed semiconductor device, in accordance with embodiments of the invention.

FIG. 2 shows a top view of a portion of a partially formed integrated circuit device 100. While the embodiments of the invention may be used to form any device, they are particularly advantageously applied to form devices having arrays of electrical devices, including memory cell arrays for volatile and non-volatile memory devices such as DRAM, ROM, phase change, or Flash memory, including NAND Flash memory, or integrated devices having logic or gate arrays. For example, the logic array may be a field programmable gate array (FPGA) having a core array similar to a memory array and a periphery with supporting logics. Also, the array may be a fine pitch repetitive logic circuitry or embedded memory on a processor, as additional examples. Consequently, the integrated circuit device 100 may be, e.g., a memory chip or a processor, which may include both a logic array and embedded memory, or any other integrated device having a logic or a gate array.

The integrated circuit device 100 includes a central region 102, which may be termed the "array," at least partially bounded by a peripheral region 104, which may be termed the "periphery." It will be appreciated that, in a completed integrated circuit device, the array 102 will typically be densely populated with conducting lines and electrical devices such as transistors and capacitors. In a memory device, the electrical devices form a plurality of memory cells, which are conventionally arranged in a regular grid pattern at the intersections of word lines and bit lines. Desirably, pitch multiplication may be used to form features in the array 102, as discussed below. On the other hand, the periphery 104 typically comprises features larger than those in the array 102. Conventional photolithography, rather than pitch multiplication techniques, is generally used to pattern features, such as logic circuitry, in the periphery 104, because the geometric complexity of logic circuits located in the periphery 104 makes using pitch multiplication difficult, whereas the regular grid typical of element patterns in the array 102 is conducive to pitch multiplication. In addition, some devices in the periphery require larger geometries due to electrical constraints, making pitch multiplication less advantageous than conventional photolithography for such devices. In addition to possible differences in relative scale, it will be appreciated by one of ordinary skill in the art that the relative positions, and the number, of periphery 104 and array 102 regions in the integrated circuit device 11 may vary from that depicted.

Figure 3:
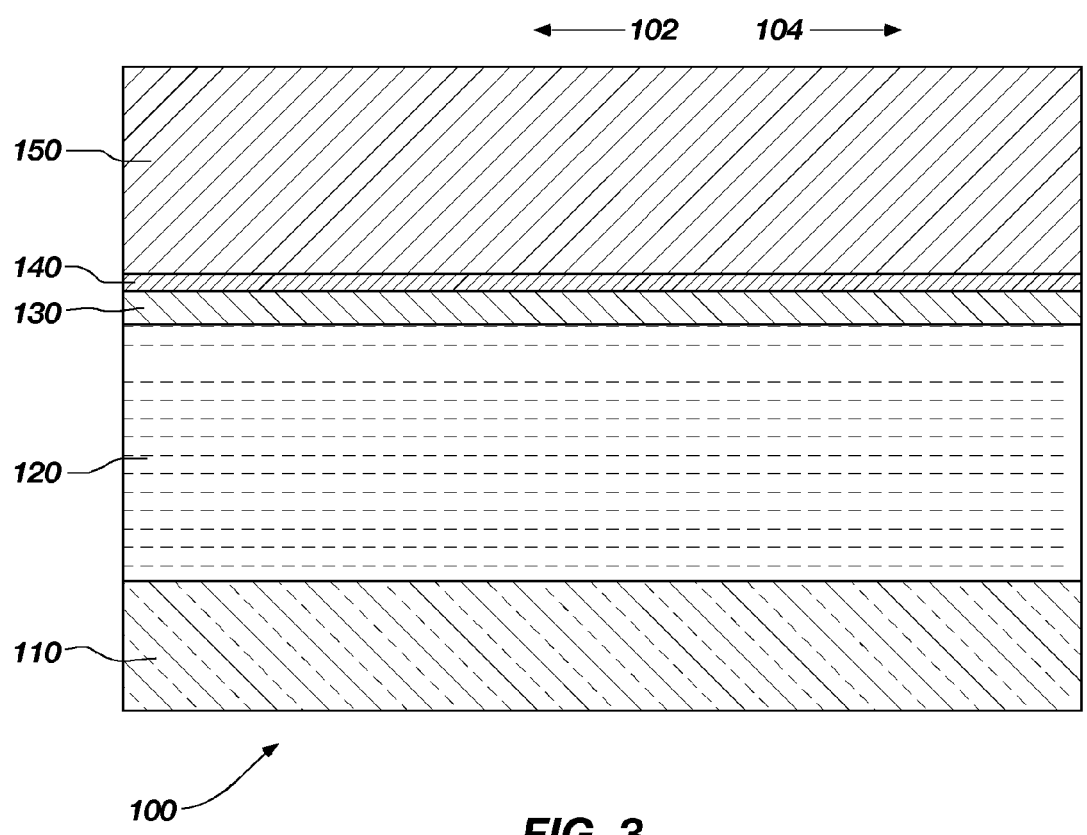
FIG. 3 shows a cross-sectional side view of a portion of the partially formed semiconductor device of FIG. 2, in accordance with embodiments of the invention.

FIG. 3 shows a cross-sectional side view of the partially formed integrated circuit device 100. Various layers 120-150 are provided for masking above a substrate 110 comprising a layer of semiconductor material. In one NAND Flash embodiment, the substrate 110 may comprise a conventional polysilicon/WSi$_x$/oxide gate stack or metal gate stack array. The layers 120-150 will be etched to form a mask for patterning the substrate 110, as discussed below.

The materials for the layers 120-150 overlying the substrate 110 are selectively chosen based upon consideration of the chemistry and process conditions for the pattern forming and pattern transferring steps discussed herein. Because the layers 120-150 between a topmost selectively definable layer 150 and the substrate 110 function to transfer a pattern derived from the selectively definable layer 150 to the substrate 110, the layers 120-140 between the selectively definable layer 150 and the substrate 110 are chosen so that they may be selectively etched relative to other exposed materials. It will be appreciated that a material is considered selectively, or preferentially, etched when the etch rate for that material upon exposure to a given etchant is substantially greater, on the order of at least about 2-3 times greater to at least about 40 times greater than the etch rate for adjacent materials exposed to the same etchant. Because a function of the layers 130-150 overlying the primary hard mask layer 120 is to allow well-defined patterns to be formed in layer 120, it will be appreciated that one or more of the layers 130-150 may be omitted or substituted if suitable other materials, chemistries and/or process conditions are used.

In the illustrated embodiment, the selectively definable layer 150, which may comprise an optically or mechanically patternable layer overlies a hard mask, or etch stop, layer 140, which overlies a hard mask layer 130, which overlies the mask layer 120, which overlies the substrate 110 to be processed (e.g., etched) through a mask. Beneficially, the mask through which the substrate 110 is processed is formed in the hard mask layer 130 and/or in the mask layer 120.

With continued reference to FIG. 3, the selectively definable layer 150 is photodefinable, e.g., formed of a photoresist, including any photoresist known in the art. For example, the photoresist may be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. In addition, maskless lithography, or maskless photolithography, may be used to define the selectively definable layer 150. Examples of photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are typically used with photolithography systems utilizing relatively short wavelength light, e.g., 193 nm. KrF photoresists are used with longer wavelength photolithography systems, such as 248 nm systems. In other embodiments, the layer 120 and any subsequent resist layers may be formed of a resist that may be patterned by nano-imprint lithography. e.g., by using a mold or mechanical force to pattern the resist. The selectively definable layer 150 will allow a first feature having a first size to be formed in the periphery 104. It will be appreciated that light reflections may decrease the precision with which photolithography may define the edges of a pattern. Optionally, a bottom anti-reflective coating (BARC) (not shown) may similarly be used in addition to the first hard mask layer 140 to control light reflections.

The material for the hard mask layer 130, which functions as an etch stop and exhibits anti-reflective properties, comprises an inorganic material. Suitable materials for hard mask layer 130 include silicon oxide ($SiO_2$) or a deep ultra-violet (DUV) dielectric anti-reflective coating (DARC), such as a silicon-rich silicon oxynitride. In this embodiment of the invention, the hard mask layer 130 is a dielectric anti-reflective coating (DARC). Using a DARC for the hard mask layer 130 may be particularly advantageous for forming patterns having pitches near the resolution limits of a particular photolithographic technique. The DARC may enhance resolution by minimizing light reflections, thus increasing the precision with which photolithography may define the edges of a pattern. By way of nonlimiting example, the DARC layer may comprise a DUV DARC of about 200-400 Å (20-40 nm) thickness. Other suitable materials that exhibit adequate etch stop and anti-reflective properties may be used for the hard mask layer 130.

In the illustrated embodiment, the hard mask or etch stop layer 140 is formed of silicon, e.g., poly amorphous silicon, or a film of another material that exhibits good etch selectivity to oxide. Other suitable materials for the first hard mask layer 140 may include a silicon oxide, e.g., a low silane oxide (LSO), low temperature nitride, and a thin layer of aluminum oxide, such as $Al_2O_3$. The LSO is formed by chemical vapor deposition using a relatively low silane flow and a relatively high $N_2O$ precursor flow. Advantageously, such a deposition can be performed at relatively low temperatures, e.g., less than about 550° C., for example, less than about 400° C., to prevent damage to the underlying primary mask layer 120, when the layer 120 is formed of a temperature-sensitive material. It will be appreciated that oxides may typically be etched with greater selectivity relative to silicon than nitrides. For example, conventional etch chemistries for oxides may remove the oxides at a rate more than 10 times faster than amorphous silicon, while conventional etch chemistries for nitrides typically only remove the nitrides at a rate of about three times faster than poly amorphous silicon. As a result, both the spacers (discussed below) and the second hard mask layer are preferably formed of the same material, in the form of an oxide, when the first hard mask layer is formed of poly amorphous silicon.

The mask layer 120 may be formed of amorphous carbon due to the excellent etch selectivity of this material relative to many other materials, including a very high etch selectivity relative to the hard mask materials. Further, the transparent carbon is a form of amorphous carbon that is highly transparent to light and that offers further improvements for photo alignment by being transparent to the wavelengths of light used for such alignment. Deposition techniques for forming such transparent carbon are known to those of ordinary skill in the art and, so, need not be further described. The amorphous carbon is particularly advantageous for transferring patterns to difficult-to-etch substrates, such as the substrate 110 comprising multiple materials or multiple layers of materials, or for forming small and high aspect ratio features therein.

The combination of materials for the hard mask layers 130 and 140 are selectably chosen based upon the material used to form a first feature in the periphery 104 in combination with providing the material used to form the spacers in the array 102 allowing transfer of the pattern or mask formed by the layers, as discussed below, into the underlying mask layer 120. As previously mentioned, the mask layer 120 of the current embodiment is formed of amorphous carbon and layer 150 is formed of photoresist. Optionally, other combinations of materials may be utilized to advantage, for example and without limitation, including (spacer material/first hard mask material/second hard mask material): oxide/amorphous silicon/oxide; nitride/amorphous silicon/oxide; nitride/oxide/amorphous silicon; amorphous silicon/oxide/amorphous silicon; carbon/amorphous silicon/oxide; and carbon/oxide/amorphous silicon. It will be appreciated that the oxide may be a form of silicon oxide and the nitride may be silicon nitride. Where the spacer material is oxide, as discussed below, the associated hard mask layer 120 is a material that is preferentially etchable relative to the oxide. For example, the hard mask layer 120 may be formed of a silicon-containing material. Depending on the selection of appropriate etch chemistries and neighboring materials; examples of other materials include amorphous carbon and etchable high dielectric materials.

In addition to selecting appropriate materials for the various layers, the thicknesses of the layers 120-150 are selectively chosen depending upon compatibility with the etch chemistries and process conditions described herein. As discussed above, when transferring a pattern from an overlying layer to an underlying layer by selectively etching the underlying layer, materials from both layers are removed to some degree. Thus, the upper layer is sufficiently thick so that it is not removed over the course of the pattern transfer to the underlying layer but no so thick as to create an undesirable topography.

In the illustrated embodiment, the selectively definable layer 150 is about 2000 angstroms ("Å") (200 nm) in thickness and, in other embodiments, may range in thickness from 500-3000 Å (50-300 nm). It is also recognized that the thickness of the selectively definable layer 150 may be to a greater or lesser extent than the 2000 Å illustrated. It will be appreciated that, in cases where the layer 150 is a photoresist, the thickness of the layer 150 may vary depending upon the wavelength of light used to pattern the layer 120. A thickness of about 500-3000 Å (50-300 nm) thick and, more specifically, a thickness of about 2000-2500 Å (200-250 nm), is particularly advantageous for 248 nm wavelength systems.

The hard mask layer 140 has a thickness of about 150-200 Å (20 nm) and, in other embodiments, may range in thickness to a greater or lesser extent than the 200 Å illustrated. One particularly suitable thickness is 100 Å. The hard mask layer 140 may have a thickness ranging from about 100 Å (10 nm) to about 400 Å (40 nm). The hard mask layer 130 is about 200-600 Å (20-60 nm) thick and, in other embodiments, may range in thickness to a greater or lesser extent. For example, the layer 130 may have a thickness of about 300-500 Å (30-50 nm).

As discussed above, the thickness of the mask layer 120 is chosen based upon the selectivity of the etch chemistry for etching the substrate and based upon the materials and complexity of the substrate. Advantageously, a thickness for mask layer 120 of about 3000 Å (300 nm) and, in other embodiments a thickness between 1000-5000 Å (100-500 nm) is particularly effective for transferring patterns to a variety of substrates, including substrates having a plurality of different materials to be etched during the transfer.

Transferring patterns into a variety of substrates is accommodated readily when utilizing a mask layer 120 of sufficient thickness. For example, the illustrated substrate 110 comprising a plurality of layers (not shown) may be etched to form word lines over an array of gate stacks. The layers of the substrate 110 may include a tungsten silicide layer overlying a polysilicon layer, which overlies an oxide-nitride-oxide (ONO) composite layer, which overlies a polysilicon layer, the layers in combination and as previously processed comprising an array of gate stacks.

The various layers discussed herein may be formed by various conventional methods. For example, spin-on-coating processes may be used to form photoresist, selectively definable layers. Various vapor deposition processes, such as chemical vapor deposition, may be used to form hard mask layers. Depositing each layer of materials may include depositing a material by coating, layering, or spinning, for example.

A low temperature chemical vapor deposition (CVD) process may be used to deposit the hard mask layers or any other materials, e.g., spacer material described herein, over the mask layer 120, especially in cases where the mask layer 120 is formed of amorphous carbon. Advantageously, it is known to those of ordinary skill in the art that the hard mask layers 140 and 130 may be deposited at relatively low temperatures of less than about 550° C., lower than about 450° C., and even lower than about 400° C. Such low temperature deposition processes advantageously prevent chemical or physical disruption of a mask layer 120 made of amorphous carbon material. Various methods for forming these layers are known to those of ordinary skill in the art and are described in U.S. Pat. No. 7,115,525, U.S. Pat. No. 6,573,030, and U.S. Pat. Pub. No. 2006/0211260, the entire disclosures of each of which documents are incorporated herein by reference.

After formation of the various layers 120-150 as described above, to improve and enhance the quality of a pattern of spacers formed by pitch multiplication, a first pattern of features is formed according to an embodiment of the invention. Then, a second pattern of spacers may be formed by pitch multiplication, followed by subjecting the patterns to a so-called "loop chop" process to eliminate closed loops formed in the mask. The pattern of features and the pattern of spacers at this point are consolidated for transferring into the substrate. The quality of the final structure formed within the substrate is improved by forming of the first pattern of features before forming the second pattern of spacers during a masking process. Specifically, as the second pattern of spacers is more sensitive to masking-related sensitivities and transferring processes than the first pattern of features, this process flow according to embodiments of the invention enables quality improvement in the second pattern of spacers by first subjecting the less dimensionally sensitive structures of the first pattern to the forming process.

In accordance with an embodiment of the invention, a first pattern of features is formed principally in the periphery of the device. Each feature of the first pattern includes, particularly at minimum or larger critical dimensions that are directly formable in the photodefinable material of the selectively definable layer, and do not require a pitch reduction or multiplication technique as is required to obtain smaller critical dimensions of the spacers of the second pattern, as will be discussed below.

Figure 4:
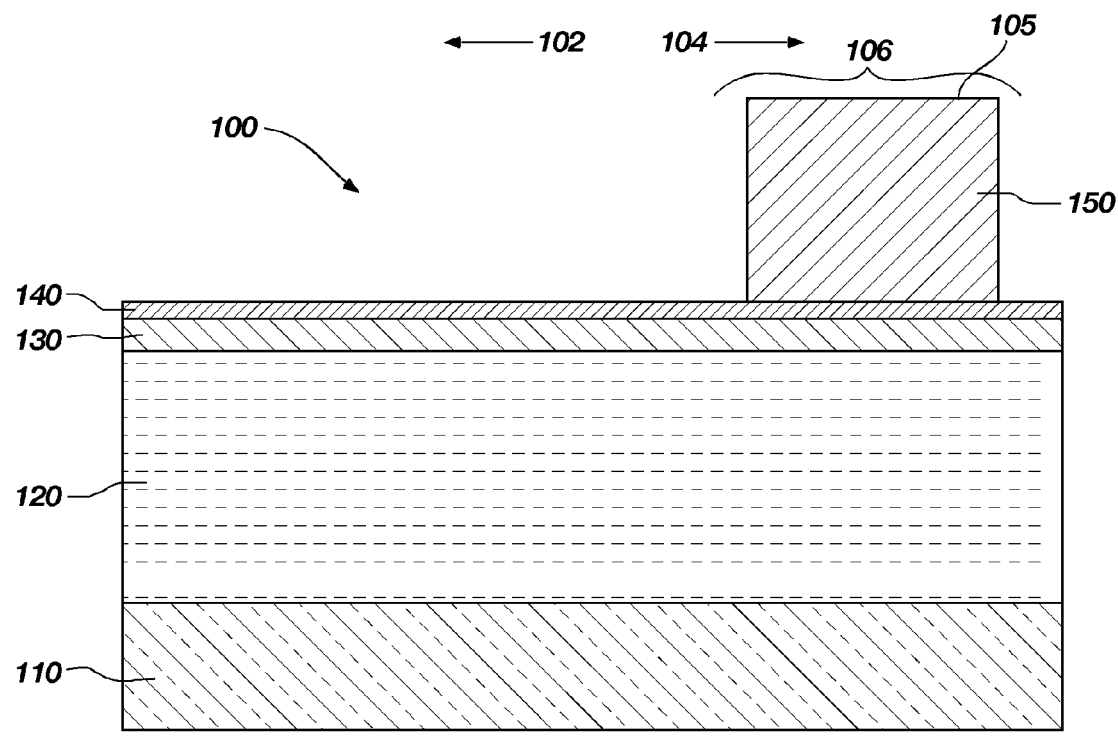
FIG. 4 shows a cross-sectional side view of the portion of partially formed semiconductor device of FIG. 2 after forming a pattern of features in a selectively definable layer in the periphery of the device in accordance with embodiments of the invention.

With reference to FIG. 4, a first pattern 106 of features 105 is formed in the selectively definable layer 150. The selectively definable layer 150 may be patterned by, edgy, photolithography, in which the layer 150 is exposed to radiation through a reticle and then developed. After being developed, the remaining photodefinable material, photoresist in this embodiment, comprises features 105 (only one feature shown for clarity). Each feature 105 of the first pattern 106 may form various landing pads, transistors and local interconnects, for example and without limitation, and generally may have a size larger than the smaller critical dimensions obtained with the spacers of the second pattern, as discussed below.

Figure 5:
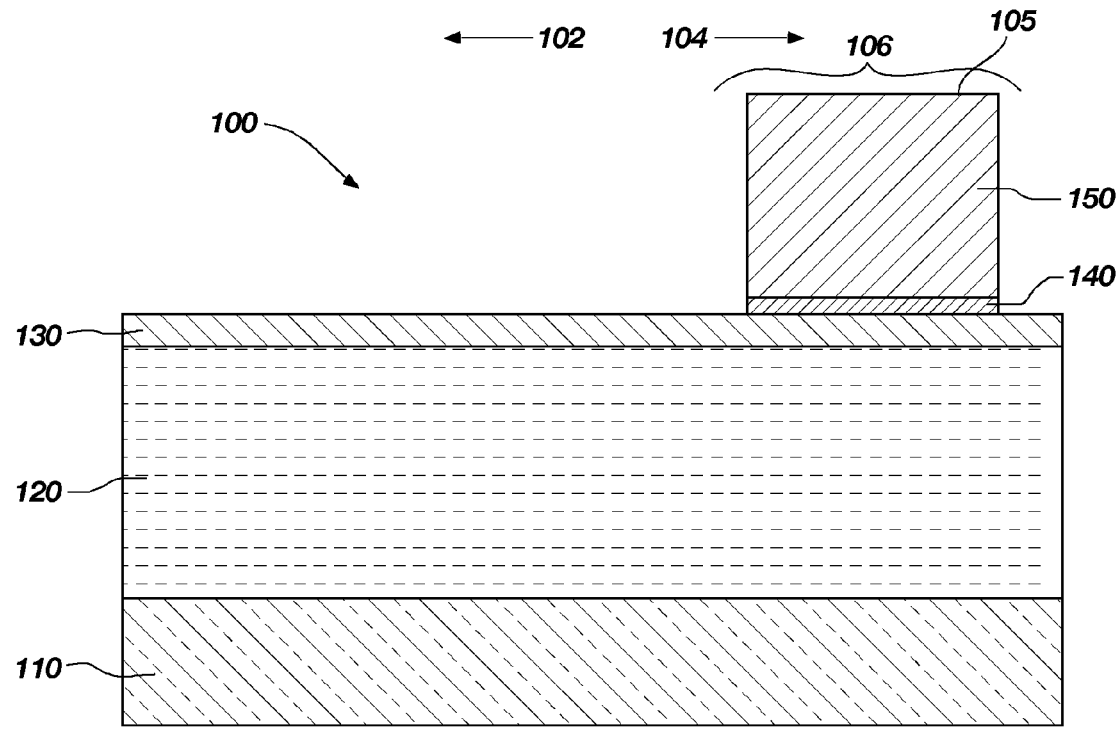
FIG. 5 shows a cross-sectional side view of the portion of partially formed semiconductor device of FIG. 2 after transferring the pattern of features into a first hard mask layer in accordance with embodiments of the invention.

After forming the first pattern 106, the hard mask layer 140 is etched to transfer the first pattern 106 formed in layer 150 down to the hard mask layer 140 as shown in FIG. 5. The hard mask layer 140, formed of amorphous silicon, is anisotropically etched using, for example, an HBr and $Cl_2$-containing plasma, and stopping the etch at the hard mask layer 130. This so called "dry" etch of the HBr and $Cl_2$-containing plasma etches the amorphous silicon at a rate greater than about five times, and even as great as ten times, the rate at which the photoresist material of the features 105 may be etched. It is recognized that etching hard mask layer 140 may consume some of the DARC material of the hard mask layer 130, for example, between 20-30 A (4-5 nm), which may leave the surface of layer 130 slightly nonuniform in topography. The uniformity of the hard mask layer 130 is addressed below when forming the second pattern of spacers. HBr and $Cl_2$ chemistry-based etchants exhibit good selectivity to oxide. Other suitable etchants may include $C_2F_6/Cl_2/O_2$, $SF_6$, and $CF_4$ for example and without limitation.

Figure 6:
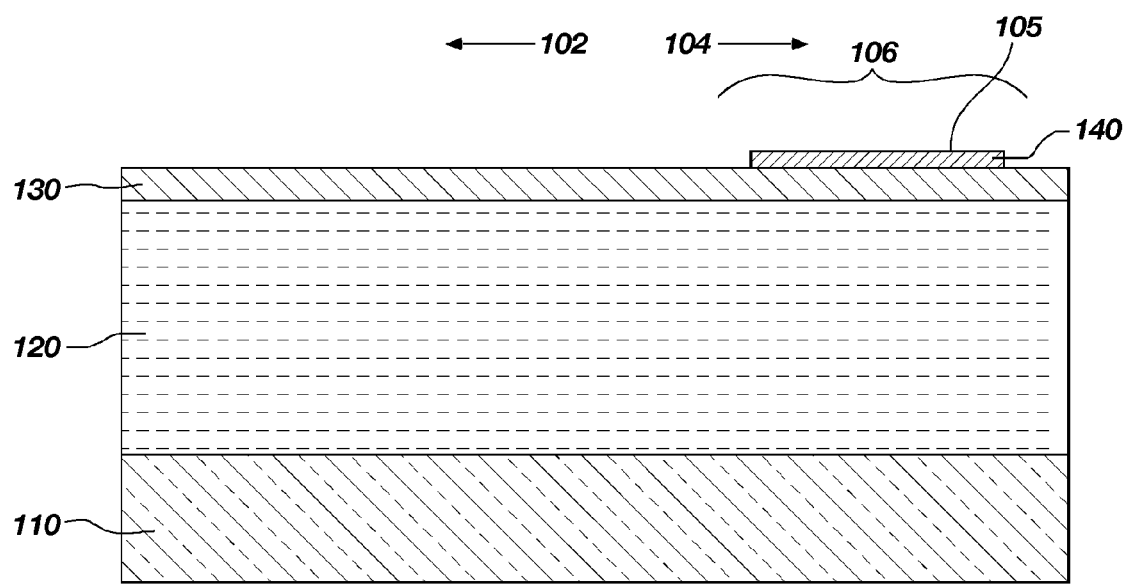
FIG. 6 shows a cross-sectional side view of the portion of partially formed semiconductor device of FIG. 2 after stripping off the material of the selectively definable layer in accordance with embodiments of the invention.

With reference to FIG. 6, the first pattern 106 is cleaned while stripping the selectively definable layer 150. The carbon material forming the photoresist layer 150 and DARC hard mask layer 130 may polymerize upon contact with etchants. For example, the $HBr/Cl_2$ etch of the hard mask layer 140 may cause parts of the layers 150 and 130 to polymerize and leave a residue around features 105 in the hard mask layer 140, causing a pattern having undesirably non-uniform features. Thus, the first pattern 106 is cleaned by stripping off organic material. The strip may be accomplished using, for example, an isotropic etch with $O_2$ plasma or other etch processes recognized as suitable by a person of ordinary skill in the art for preserving the features 105 in the hard mask layer 140.

Next, a second pattern of spacers is formed by pitch multiplication over the first pattern 106 of features 105. The second pattern comprises spacers having smaller critical dimensions than the first pattern 106 of features 105 as formed. In addition, the second pattern may be formed completely, partially, or not overlapping the first pattern 106.

Figure 7:
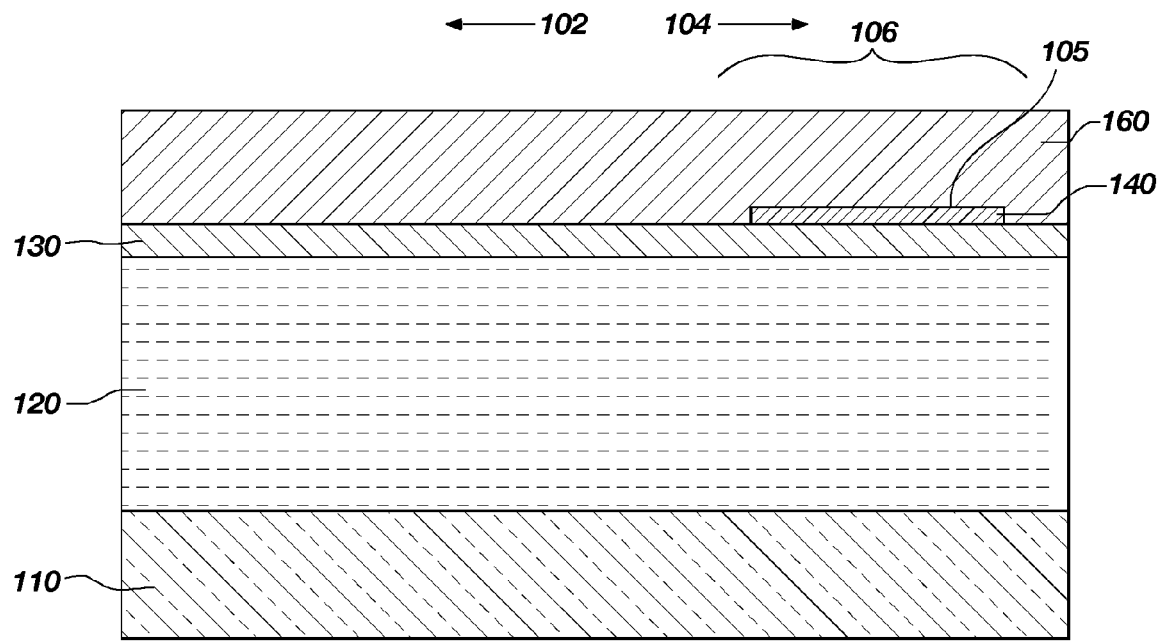
FIG. 7 shows a cross-sectional side view of the portion of partially formed semiconductor device of FIG. 2 after layering on another selectively definable layer over the pattern of features and upon a second hard mask layer in accordance with embodiments of the invention.

Turing to FIG. 7, to allow the second pattern to be formed, a selectively definable layer 160 is formed on, and overlies, the hard mask layer 130 and first pattern 106 of features now formed in the first hard mask layer 140 to allow for patterning of the second pattern in the array 102.

As with the selectively definable layer 150, the selectively definable layer 160 may be photodefinable, e.g., formed of a photoresist, including any suitable photoresist known in the art, such as a trimmable mandrel material. In addition, in other embodiments, the selectively definable layer 160 may be formed of a resist suitable for patterning by nano-imprint lithography.

Optionally, while not necessarily required, a planar surface (not shown) may be formed prior to depositing the layer 160 by depositing a planarizing material (not shown) around the features 105 and upon the second hard mask layer 130 when required for improving the planarity of structure of the to-be-patterned array for forming spacers. Specifically, the planarizing layer may be employed where the resolution of the spacers to be formed in the second pattern may not be adequately defined without first providing a planarized surface. For example, a spin-on antireflective coating may be used for planarization purposes.

Figure 8:
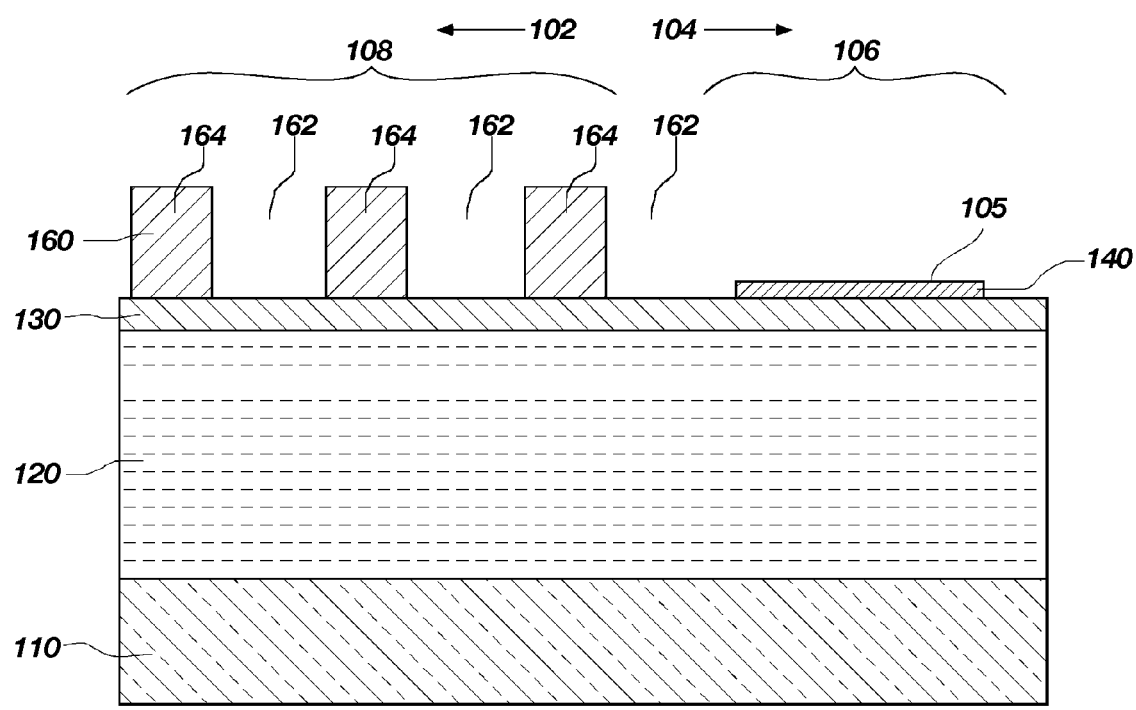
FIG. 8 shows a cross-sectional side view of the portion of partially formed semiconductor device of FIG. 2 after forming a pattern of lines in the another selectively definable layer in the array of the device in accordance with embodiments of the invention.

With reference to FIG. 8, the selectively definable layer 160 is patterned using, e.g., the same photolithographic technique used to pattern the selectively definable layer 150. Thus, a second pattern 108 is formed in the selectively definable layer 160. Mere the second pattern 108 is used to mask features in the array 102, the area in the selectively definable layer 160 in the periphery 104 is preferably open, as illustrated. As noted above, however, while illustrated laterally adjacent the first pattern 106, the second pattern 108 may partially or completely overlap the first pattern 106 or be completely separated from the first pattern 106. Thus, the use of different reference numerals (106 and 108) for these respective patterns indicates that they were originally formed in different acts.

The process flow as described below results in the second pattern 108 that includes a pitch or feature size smaller than the minimum pitch or resolution of the photolithographic technique used in forming it, unlike the first pattern 106 that includes pitch or feature size equal to or greater than the minimum pitch or resolution of the photolithographic technique used to form the first pattern 106. It will be appreciated that the second pattern 108 in the array 102 may be used to form arrays of conductive feeds, contacts and other semiconductor components when transferred into the substrate 110 for example and without limitation.

The second pattern 108 includes spaces or trenches 162, which are delimited by photodefinable material features, or lines, 164 formed in the photodefinable layer 160. The trenches 162 may be formed by, for example, photolithography with 248 nm or 193 nm wavelengths light, in which the layer 160 is exposed to radiation through a reticle and then developed as is known by a person of ordinary skill in the art. After being developed, the remaining photodefinable material, photoresist in the illustrated embodiment, forms mask features such as the array of lines 164 (shown in cross-section only) as illustrated.

The resulting pitch of the lines 164 is equal to the sum of the width of a line 164 and the width of a neighboring space 162. To minimize the critical dimensions of features formed using this pattern of lines 164 and spaces 162, the pitch may be at or near the limits of the photolithographic technique used to pattern the photodefinable layer 160. For example, for photolithography utilizing 248 nm tight, the pitch of the lines 164 can be about 1000 Å (100 nm). Thus, the pitch may be at the minimum pitch of the photolithographic technique and the spacer formed in the pattern as discussed below may advantageously have a pitch below the minimum pitch of the photolithographic technique.

Figure 9:
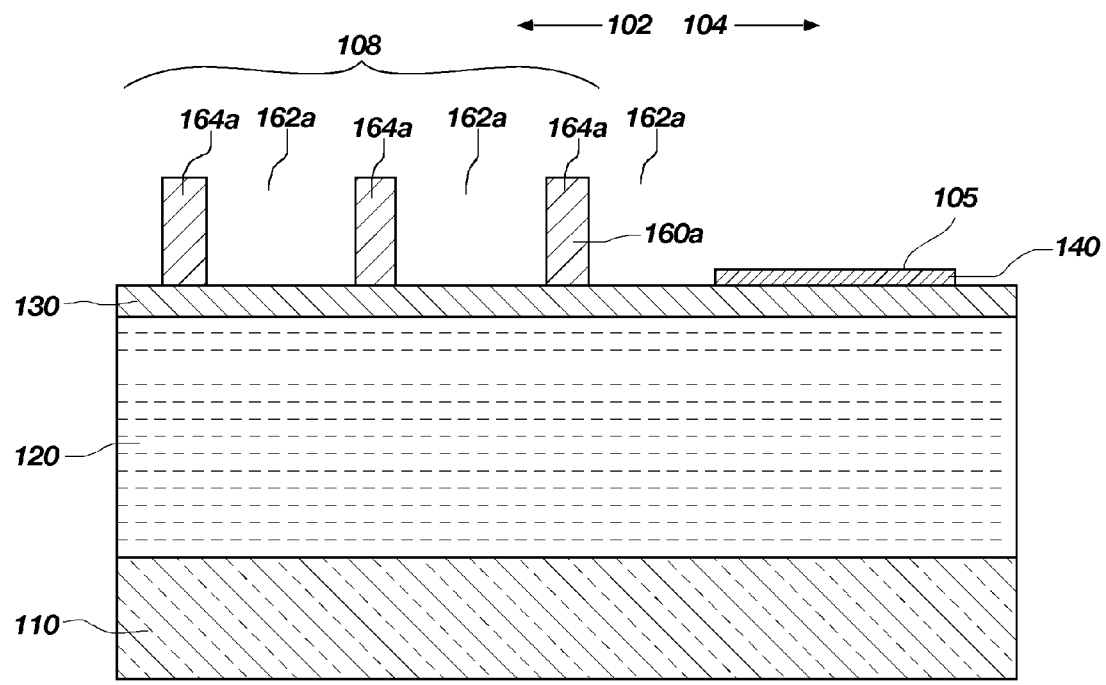
FIG. 9 shows a cross-sectional side view of the portion of partially formed semiconductor device of FIG. 2 after widening spaces between lines in the another selectively definable layer in accordance with embodiments of the invention.

As shown in FIG. 9, the spaces 162 may be widened by etching the photoresist material of the lines 164, to form modified spaces 162*a* and lines 164*a*. The photoresist lines 164 are etched using an isotropic etch to "shrink" those features. Suitable etches include etches using an oxygen-containing plasma, e.g., a $SO_2/O_2/N_2/Ar$ plasma, a $Cl_2/O_2/He$ plasma or an $HBr/O_2/N_2$ plasma. The extent of the etch is selected so that the widths of the lines 164*a* are substantially equal to the desired spacing between the later-formed spacers (172 in FIG. 11), as will be appreciated from the discussion below. For example, the width of the lines 164 may be reduced to 800-1200 Å (80-120 nm) or even further reduced to about 400-700 Å (40-70 nm). Advantageously, the width-reducing etch allows the lines 164*a* to be narrower than would otherwise be possible using the photolithographic technique used to pattern the selectively definable layer 160. In addition, the etch may smooth the edges by removing material of the resist lines 164*a*, thus improving the line edge roughness uniformity of those lines. While the critical dimensions of the lines 164*a* may be etched below the resolution limits of the photolithographic technique, it will be appreciated that this etch does not alter the pitch of the spaces 162*a* and lines 164*a*, since the distance between identical relative points in these features remains the same.

Figure 10:
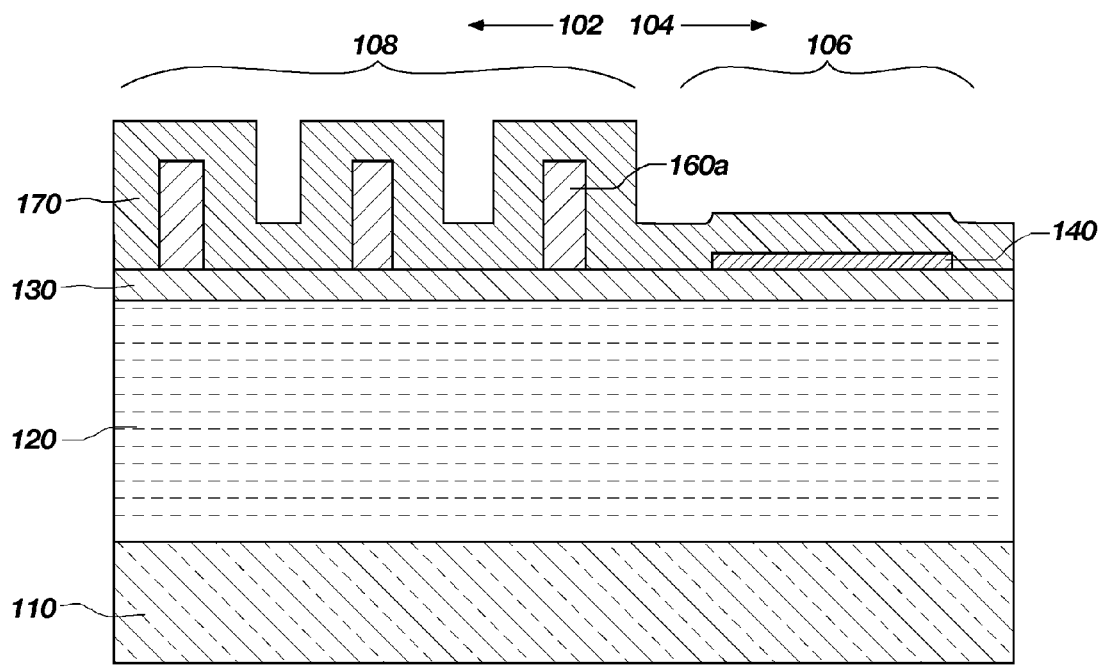
FIG. 10 shows a cross-sectional side view of the portion of partially formed semiconductor device of FIG. 2 after depositing a layer of spacer material over the patterns in accordance with embodiments of the invention.

Next, as shown in FIG. 10, a layer 170 of spacer material is preferably blanket deposited conformally over exposed surfaces, including the hard mask layer 130 and the top and sidewalls of the patterned, modified definable layer 160*a*. The spacer material may be any material that can act as a mask for transferring a pattern to the underlying hard mask layer 130. The spacer material is selected for deposition with good step coverage, at a temperature compatible with the modified definable layer 160*a*, and suitability for etching relative to the modified definable layer 160*a* and the underlying hard mask layer 130. Materials for the layer 170 may include silicon, silicon oxides and silicon nitrides. In the illustrated embodiment, the spacer material is a silicon oxide deposited at a relatively low temperature, such as 75° C., which provides particular advantages in combination with other selected materials of the masking stack.

Figure 11:
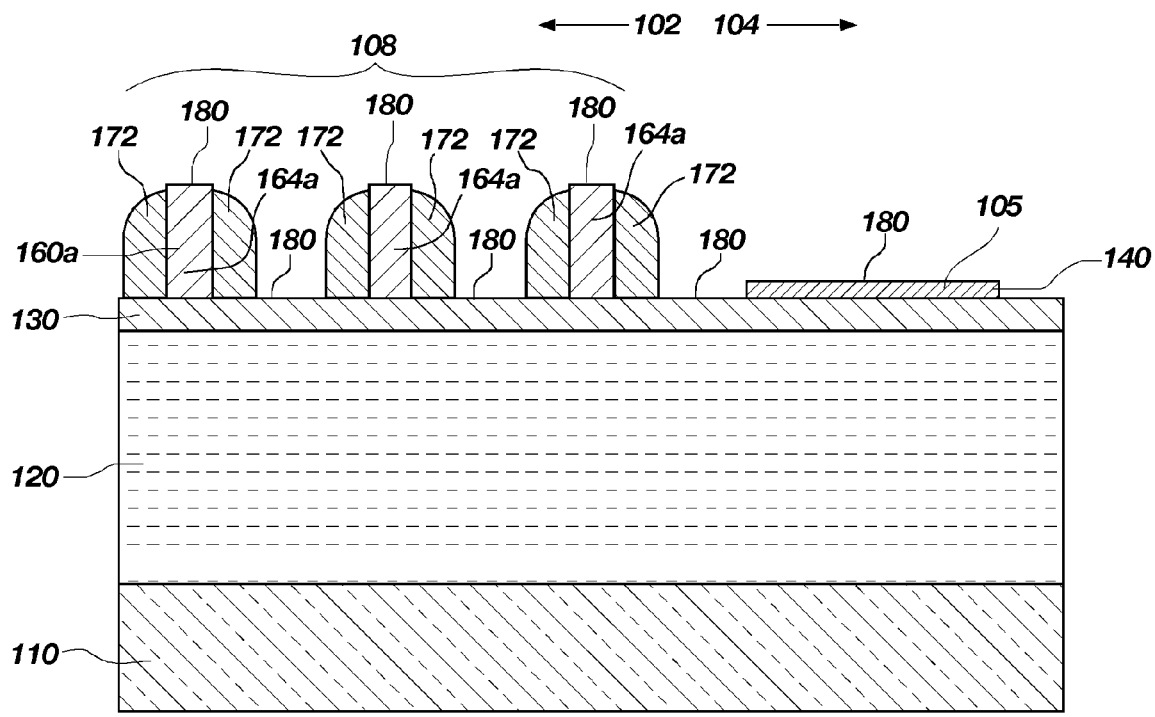
FIG. 11 shows a cross-sectional side view of the portion of partially formed semiconductor device of FIG. 2 after etching the layer of spacer material in accordance with embodiments of the invention.

Methods for depositing the material of the spacer layer 170 may include chemical vapor deposition, e.g., using $O_3$ ad TEOS to for silicon oxide, and atomic layer deposition, e.g., using a silicon precursor with an oxygen or nitrogen precursor to form silicon oxides and nitrides, respectively. The thickness of the spacer layer 170 is preferentially determined based upon the desired width of the spacers 172 (FIG. 11). For example, in his embodiment, the layer 170 is deposited to a thickness of about 200-800 Å (20-80 nm). In other embodiments, the layer 170 may be deposited to a thickness ranging between 400-600 Å (40-60 nm). In still other embodiments, the layer may range between about 100-300 Å (10-30 nm) or to a greater or lesser extent than illustrated. The spacer layer 170 formed over the first pattern 106 of features 105 in the periphery 104 of the device 100 may see uneven steps ranging about 250 Å (25 nm) in size, which will be stripped away when forming the spacers 172 as shown in FIG. 11 without substantial alteration of the features 105 as formed.

Turning now to FIG. 11, the spacers 172 are now formed in the second pattern 108 by exposing the silicon oxide material of the spacer layer 170 to an anisotropic etch to remove spacer material from horizontal surfaces 180 of the partially formed device 100 while stopping on the surface of the first hard mask layer 140 and the second hard mask layer 130. Such an etch, also known as "spacer etch," may be performed using a fluorocarbon plasma containing, for example and without limitation, $CF_4/CHF_3$, $C_4F_8/CH_2F_2$ or $CHF_3/Ar$ plasma. The material of the modified definable layer 160*a* may be selectively retained between adjacent spacers 172 while further processing to remove portions of the spacer material is performed in accordance with embodiments of the invention as described below. Beneficially, retaining the material used to form the lines 164*a* of the modified definable layer 160*a* between adjacent spacers 172 enhances the quality of a portion of the spacers 172 by not subjecting the material to extra processing or cleaning steps that may undesirably erode or otherwise damage or displace the spacers prior to their ultimate pattern transfer to the underlying substrate 110.

Figure 12:
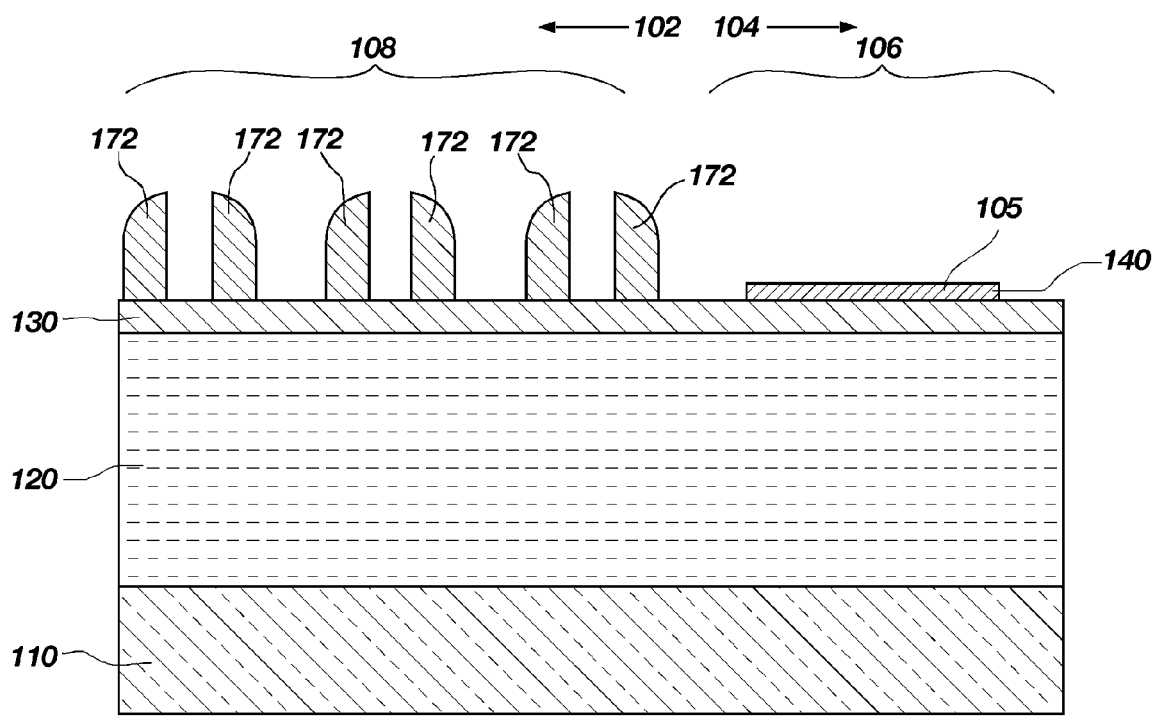
FIG. 12 shows a cross-sectional side view of the portion of partially formed semiconductor device of FIG. 2 after etching the layer of spacer material and stripping the lines of the another selectively definable layer in accordance with embodiments of the invention.

Optionally, in other embodiments of the invention as shown in FIG. 12, the modified definable layer 160*a* may be removed to leave the spacers 172 in freestanding alignment. In such an instance, the modified definable layer 160*a* may be selectively removed using an organic strip process as described above. Optional etch chemistries may include an oxygen-containing plasma etch, such as etching using an $O_2$ plasma strip.

Thus, pitch reduction or multiplication for spacers 172 has been accomplished. In the illustrated embodiment, the pitch of the spacers 172 is roughly half that of the photoresist lines 164 and spaces 162 (FIG. 8) originally formed by photolithography. Where the photoresist lines 164 had a pitch of about 2000 Å (200 nm), spacers 172 having a pitch of about 1000 Å (100 nm) or less may be formed. It will be appreciated that, because the spacers 172 are formed on opposing sidewalls of each of the features or lines 164*a*, the spacers 172 generally follow the outline of the pattern of features or lines 164*a* in the modified photodefinable layer 160*a* and, so, form a closed loop around the ends of the lines 164*a*. The spacers 172 form relatively smaller features of the second pattern 108 that may be transferred to the underlying substrate 110 together with the relatively larger features 105 forming the first pattern 106. Advantageously, the first pattern 106 and the second pattern 108 may now be subjected to so-called "loop chop" process to eliminate undesirable closed loops or other portions of pattern material before transferring the mask to the substrate 110.

Optionally, a second pattern of spacers may be formed after the first pattern of features is formed by utilizing other methods of pitch multiplication. Other methods of pitch multiplication may require layering different or select layers of material above the substrate in addition to the layers mentioned herein. For example, a method of forming a pattern of spacers by pitch multiplication is described in paragraphs [0056]-

[0092] and FIGS. 2A-10 of U.S. Pub. No. 2006/0046422 to Tran et al., dated Mar. 2, 2006, the entire disclosure of which is incorporated by reference herein.

In methods according to embodiments of the invention, spacer material in the form of loops of spacer material connecting adjacent spacers 172 is etched to remove the loops and isolate the spacers 172. This etch may be used to form two separate lines of spacers 172 initially connected at their adjacent ends by a loop of spacer material extending around the end of a line 164*a* corresponding to two separate conductive paths to be formed in the substrate 110. It will be appreciated that more than two lines may be formed, if desired, by etching the spacers 172 at more than two locations. Other suitable method for cutting off the ends of the loops is disclosed in U.S. Pub. No. 2006/0046422 to Tran et al., dated Mar. 2, 2006, the entire disclosure of which is incorporated by reference herein.

To form the separate lines, a protective mask is formed over parts of the lines to be retained and the exposed, unprotected part of the loop of spacer material connecting the spacer lines are then etched. The protective mask is then removed to leave a plurality of physically separated and electrically isolated lines comprised of spacers 172.

Figure 13:
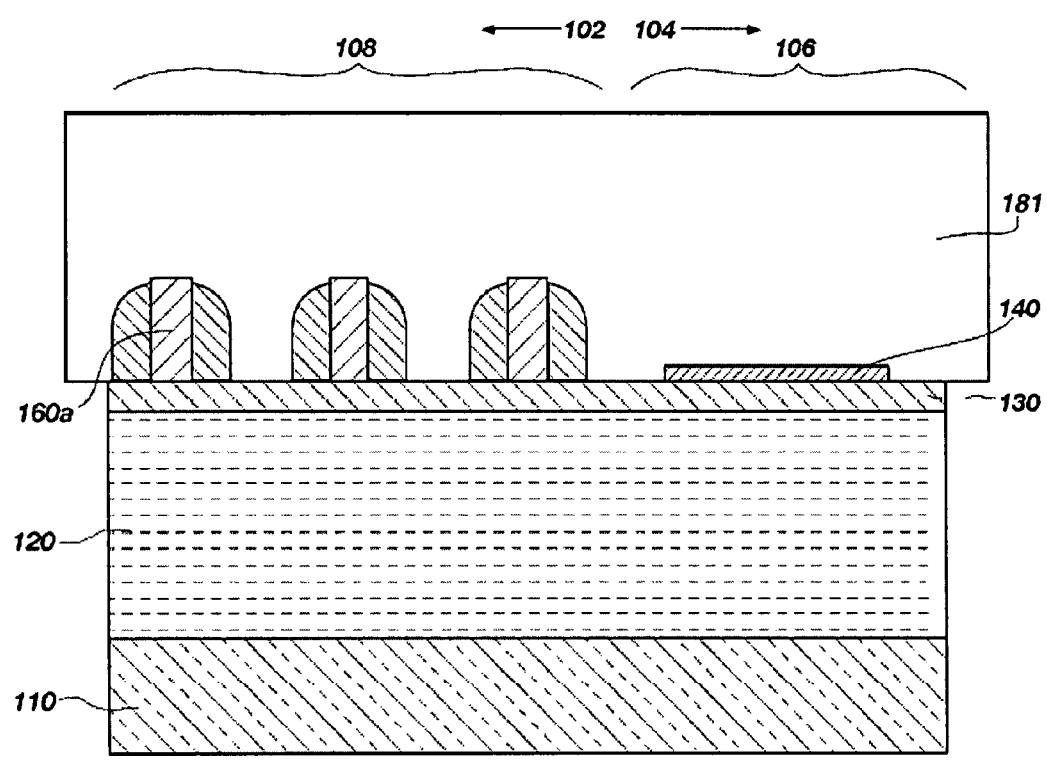
FIG. 13 shows a cross-sectional side view of the portion of partially formed semiconductor device of FIG. 2 after depositing a protective layer of material over the patterns in accordance with embodiments of the invention.
Figure 14:
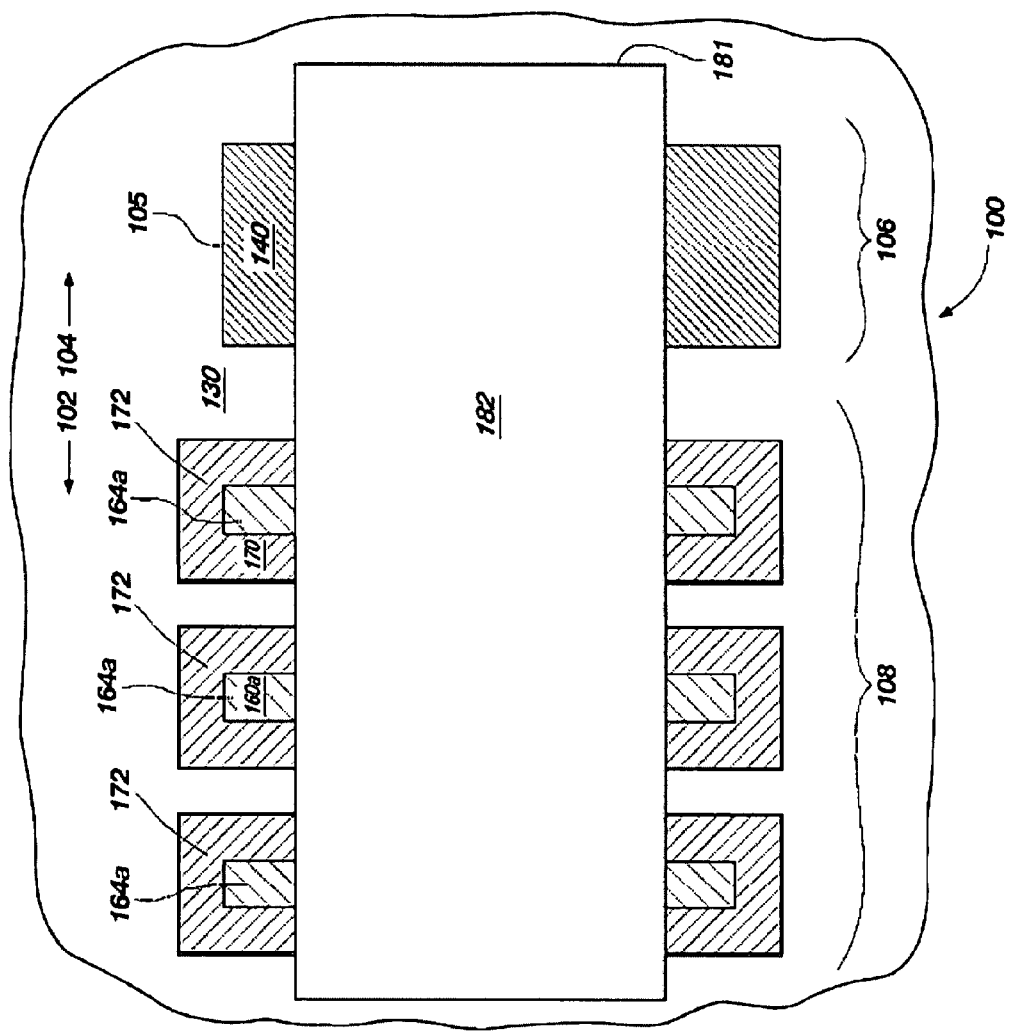
FIG. 14 shows a top view of the portion of partially formed semiconductor device of FIG. 2 after forming a protective mask in the protective layer of material over the patterns in accordance with embodiments of the invention.

With reference to FIG. 13, a protective material forming a protective layer 181 is selectively deposited around and over the spacers 172 and the parts of the layers 130 and 160 forming the pattern 108, and, in this embodiment, is selectively deposited around and over the features 105 forming the pattern 106. The material of the protective layer 181 may be a photodefinable material such as photoresist as described above and is sufficiently thick to protect the underlying mask during the etch. Optionally, an anti-reflective coating ("ARC") (not shown) may be provided under the protective layer 181, e.g., above the patterns 106 and 108, to improve photolithography results as understood by a person of ordinary skill in the art. The photoresist and the optional anti-reflective coating may be deposited using various methods known in the art, including spin-on-coating processes. With reference to FIG. 14, a protective mask 182 is subsequently patterned in the protective layer 181, e.g., by photolithography, to protect desired portions of the underlying patterns 106 and 108 from a subsequent etch. It is recognized that the pattern 106 forming the features 105 may be entirely, partially or not covered depending upon the relative resistance to etching during the etch. To separate the spacers 172 of each loop into two separate lines, portions of the loops are exposed for etching in at least two separate locations. To simplify processing, the exposed portions of the loops are generally the ends of the loops formed by the spacers 172, as illustrated.

In other embodiments, it will be appreciated that the protective layer 181 may be formed of any material that may be selectively removed, e.g., relative to the spacers 172, the layers 130, 140, 160*a*, and 170. In those cases, the protective mask 182 may be formed in another material, e.g., photoresist, overlying the protective layer 181.

Advantageously, where the ends of the spacers 172 extend in a straight line, the length and simple geometry of the straight lines may minimize the precision required for forming the protective mask 182; that is, the protective mask need only be formed so that it leaves the ends of the spacers 172 exposed. Thus, by centering the mask a selected distance from the ends of the spacers 172, a misaligned mask may cause slightly more or less of the spacers 172 to be exposed, but may still accomplish the objective of leaving the ends adequately exposed. While the margin of error for aligning the protective mask 182 is larger than if the protective mask 182 were required to form a geometrically complex shape, it is recognized that other shapes may be formed in the protective mask 182 different from the rectangular shape of the protective mask 182 as illustrated. See, for example, U.S. Pub. No. 2006/0046422 to Tran et al., the disclosure of which is incorporated herein in its entirety by reference.

Figure 15A:
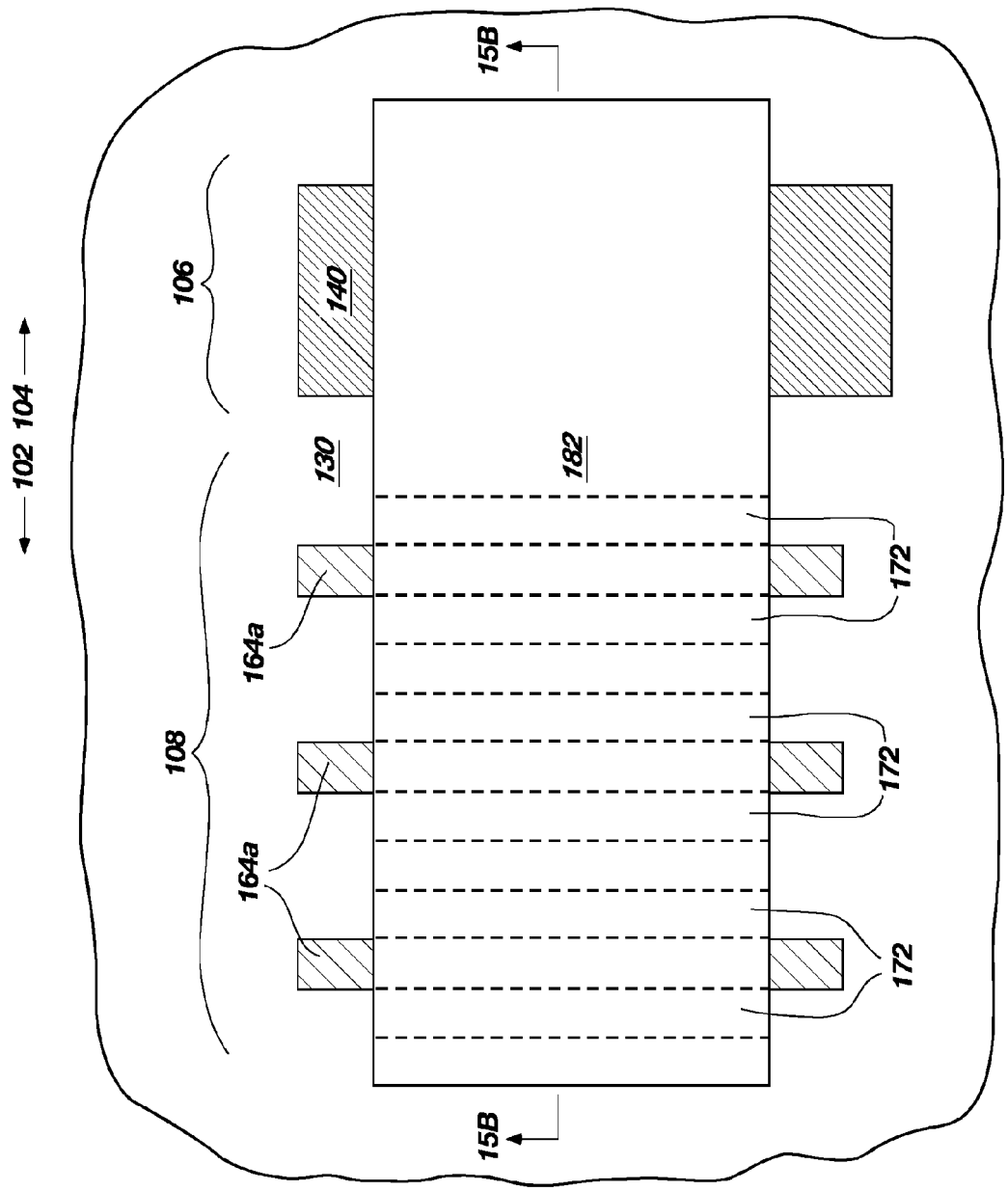
FIG. 15A shows a top view of the portion of partially formed semiconductor device of FIG. 2 after forming a "loop chop" etch of a pattern exposed by the protective mask in accordance with embodiments of the invention.
Figure 15B:
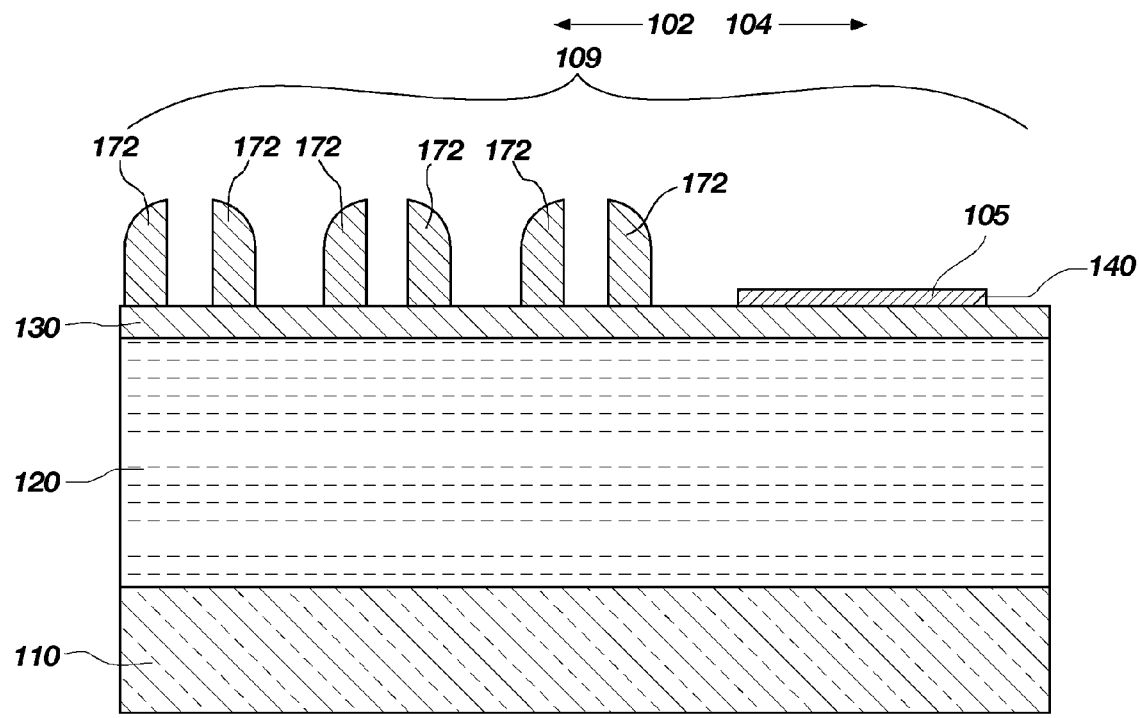
FIG. 15B shows a cross-sectional side view of the portion of partially formed semiconductor device of FIG. 2 after stripping the material of the protective mask and the lines from the device providing a modified pattern in accordance with embodiments of the invention.

With reference to FIG. 15A, the exposed portions of the spacers 172 are etched away leaving the exposed portions of the photoresist lines 164*a* and the features 105 of pattern 106. Where the spacers 172 are formed from silicon oxide or nitride, suitable etch chemistries may include a fluorocarbon etch or in the case of spacers 172 formed of an oxide, such as silicon oxide, the exposed loops of the spacers 172 may be isotropically etched using a wet chemistry, for example, a buffered oxide etch. One suitable etchant for a silicon dioxide spacer material is an $HF/H_2O$ wet etch at a 500:1 dilution ratio. After being etched, the spacers 172 no longer form a loop with a neighboring spacer 172 as illustrated. The spacers 172 as etched thus forms a modified pattern 19 of features 105 and spacers 172 with the material of the protective mask 182 removed. FIG. 15B shows a side view of the resulting structure, taken along the vertical plane as indicated in FIG. 15A with the material of the lines 164*a* removed.

Optionally, where the protective mask 182 is sufficiently thick and the lines 164*a* were not previously removed, the exposed portions of the photoresist lines 164*a* may be descummed or etched away in order to facilitate etching the exposed portions of the spacers 172. For example, an $O_2/N_2$ reactive ion etch, an $O_2$ etch, or a $CF_4$ and/or $CHF_3$ plasma etch may be employed. Also, the exposed surface of the partially fabricated device 100, i.e., the portion not protected by the protective mask 182, may be cleaned prior to the etching the exposed portions of the spacers 172.

With reference to FIGS. 15A and 15B, the materials of the protective mask 182 and of the lines 164*a* are selectively removed. Where the material is photoresist or optional ARC, etch chemistries include anisotropic etches, such as with an $SO_2$-containing plasma. In other embodiments, the mask of the partially formed device 100 may be subjected to an ashing process to remove the material of layers 181 and 160 where the material of the modified pattern 109 is compatible with the ashing process. It will be appreciated that the spacers 172 and the features 105 are not attacked during this removal act and that the primary hard mask layer 120 is protected by the second hard mask layer 130. Advantageously, by selectively removing the material of the lines 164*a* together with the material of the protective mask 182, the inner portions of the spacers 172 are subjected to less processing than would be if the material of the lines 164*a* was removed prior to the "loop chop" process, beneficially enhancing resolution and reducing variations and defects when the pattern 109 is transferred to the underlying substrate 110.

According to embodiments of the invention, the modified pattern 109 comprising the spacers 172 and the features 105 of the patterns 108 and 106, respectively, may be simultaneously transferred to the substrate 110.

Figure 16:
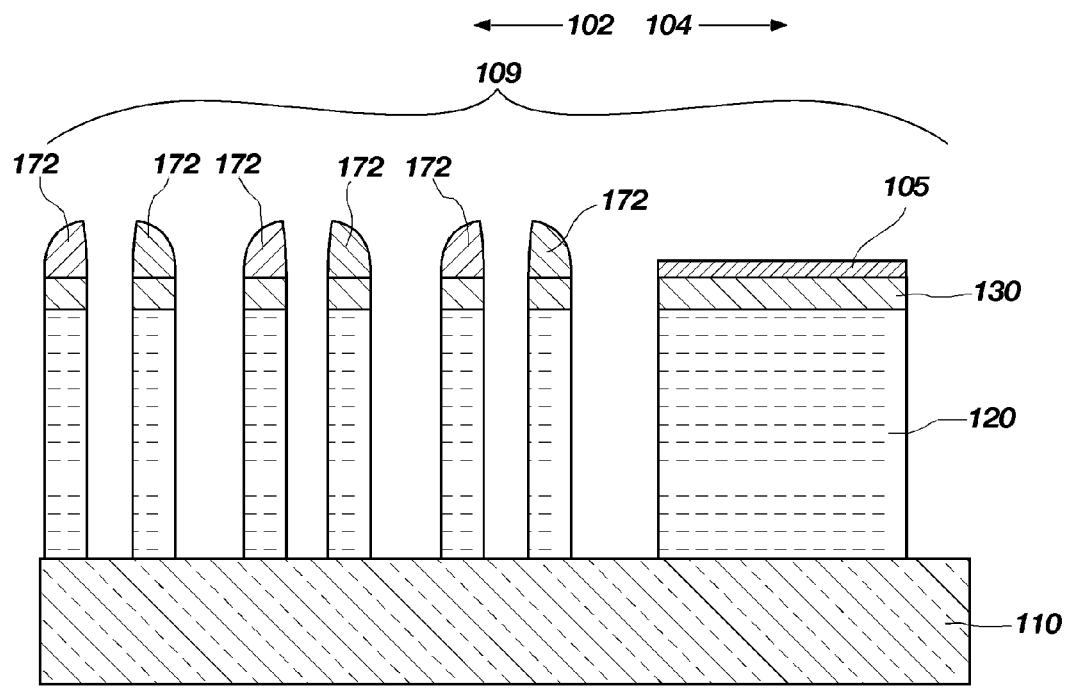
FIG. 16 shows a cross-sectional side view of the portion of partially formed semiconductor device of FIG. 2 after transferring the modified pattern to a primary hard mask layer ready for transferring into the substrate of the partially formed device.

With reference to FIG. 16, the second hard mask layer 130 and primary hard mask layer 120 are etched to transfer the modified pattern 109 down to the mask layer 120, to form a pattern of components of mixed feature size in the mask layer 120.

Optionally, before transferring the modified pattern into the layers 120 and 130, the modified pattern 109 is cleaned. As noted above, the carbon material forming the layers 130 and 181 may polymerize upon contact with etchants, leaving a residue around features or spacers on the hard mask layer 130, causing a modified pattern 109 having undesirably non-uniform feature sizes. Thus, the modified pattern 109 is cleaned by stripping off an organic material. The cleaning may be accomplished using, e.g., an isotropic etch with $O_2$ plasma and may be done simultaneously while stripping of the protective mask 182. For example, $O_2$ wet clean with an $H_2O$, $H_2O_2$, $NH_4OH$ or so-called "SC1" solution.

Turning to FIG. 16, the modified pattern 109 is transferred to the mask layer 120. The transfer is accomplished by anisotropically etching the second hard mask layer 130 and the primary mask layer 120, using an $SO_2$-containing plasma. Other suitable etch chemistries include a $Cl_2/O_2$, $HBr/O_2/N_2$ or $SiCl_4/O_2N_2/HBr$ or $SiCl_4/O_2$-containing plasma. As noted above, the $SO_2$-containing plasma is particularly suitable as it has been found to have excellent selectivity for the amorphous carbon of the mask layer 120 and the DARC of the hard mask layer 130 relative to the material of the spacers 172 and the features 105. Thus, a thick enough mask may be formed in the primary mask layer 120 to later effectively transfer the mask pattern to the substrate 110, particularly through multiple materials of the substrate using selective etch chemistries and without wearing away the mask layer 120 before the pattern transfer is complete.

After the modified pattern 109 is transferred to the mask layer 120, the pattern 109 is transferred to the substrate 110 using the patterned mask layer 120 as a mask. Given the disparate materials used for the mask layer 120 and the substrate 110 (e.g., amorphous carbon and silicon or silicon compounds, respectively), the pattern transfer can be readily accomplished using conventional etch chemistries appropriate for etching the material or materials of the substrate 110 to form the final structures therein. The process used to transfer the modified pattern 109 from the mask layer 12 and into the substrate 110 may include any suitable process known to a person of ordinary skill in the art.

The spacers 172 and the features 105 of the modified pattern 109 may be employed to respectively form interconnect lines such as word lines mid associated integrated device features, such as landing pads as transferred into the substrate. Methods for forming interconnects and landing pads are disclosed in U.S. Pub. No. 2006/0046422 to Tran et al., dated Mar. 2, 2006, the entire disclosure of which was previously incorporated herein by reference. Other methods for forming interconnects and landing pad are disclosed in U.S. Pat. No. 7,115,525 to Abatchev et al. dated Oct. 3, 2006, and U.S. Pub. No. 2006/0211260 to Tran et al., dated Sep. 21, 2006, the entire disclosures of which are incorporated herein by reference.

It will also be appreciated that the pitch of the pattern 108 may be more than doubled as is shown in the drawing figures herein, particularly before the modified pattern 109 is transferred to the substrate. For example, the pattern 108 may be further pitch multiplied by forming spacers around the spacers 172, then removing the spacers 172, then forming spacers around the spacers that were formerly around the spacers 172, and so on. For example, a method for further pitch multiplication is discussed in U.S. Pat. No. 5,328,810 to Lowrey et al., the entire disclosure of which is incorporated herein by reference. In addition, while embodiments of the invention may advantageously be applied to form a modified pattern 109 having both pitch multiplied and conventionally photolithographically defined features, the patterns 106 and 108 may both be pitch multiplied or may have different degrees of pitch multiplication.

In addition, the embodiments of the invention may be employed multiple times throughout an integrated device fabrication process to form pitch multiplied features and conventional features in a plurality of layers or vertical levels, which may be vertically contiguous or non-contiguous and vertically separated. In such cases, each of the individual levels to be patterned would constitute a substrate 110 and the various layers 120-181 may be formed over the individual level to be patterned. It will also be appreciated that the particular composition and height of the various layers 120-181 discussed above may be varied depending upon a particular application. In one regard, the layer 120 may be sufficiently thin in order to provide structural stability to the mask, to protect the substrate material throughout fabrication, and to allow the mask to be transferred into the substrate 110 without complete removal of the material of layer 120 before the final etch is finished. For example, the thickness of the layer 120 may be varied depending upon the identity of the substrate 110, e.g., the chemical composition of the substrate, whether the substrate comprises single or multiple layers of material, the depth of features to be formed, for example, and the available etch chemistries, without limitation. In some cases, one or more layers of layers 120-181 may be omitted or more layers may be added. For example, the layer 120 may be omitted in cases where the hard mask layer 130 is sufficiently durable to adequately transfer a modified pattern 109 to the substrate 110.

Also, while "processing" through the various mask layers involves etching an underlying layer, processing through the mask layers may involve subjecting layers underlying the mask layers to any semiconductor fabrication process. For example, processing may involve ion implantation, diffusion doping, depositing, or wet etching, without limitation, through the mask layers and onto underlying layers. In addition, the mask layers may be used as a stop or barrier for chemical mechanical polishing (CMP) or CMP may be performed on any of the layers to allow for both planarization and etching of the underlying layers, as disclosed in U.S. Provisional Patent Application No. 60/666,031, filed Mar. 28, 2005, the entire disclosure of which is incorporated by reference herein.

It will be appreciated that the "substrate" to which patterns are transferred may include a layer of a single material, a plurality of layers of different materials, a layer or layers having regions of different materials or structures in them, etc. These materials may include semiconductors, insulators, conductors, or combinations thereof. For example, the substrate may comprise doped polysilicon, an electrical device active area, a silicide, or a metal layer, such as a tungsten, aluminum or copper layer, or combinations thereof. In some embodiments, the mask features discussed herein may directly correspond to the desired placement of conductive features, such as interconnects, in the substrate. In other embodiments, the substrate may be an insulator and the location of mask features may correspond to the desired location of insulators, such as in damascene metallization. Examples of structures formed in the substrate include gate stacks and shallow trench isolation structures.

Further, in any of the acts described herein above, transferring a pattern from an overlying level to an underlying level involves forming features or spacers in the underlying level that generally correspond to features or spacers in the overlying level. For example, the path of lines in the underlying level will generally follow the path of lines in the overlying level and the location of other features in the underlying level will correspond to the location of similar features or spacers in the overlying level. The precise shapes and sizes of features and spacers may vary from the overlying level to the underlying level, however. For example, depending upon etch chemistries and conditions, the sizes of and relative spacing between the features and spacers forming the transferred patterns may be enlarged or diminished relative to the pattern on the overlying level, while still resembling the same initial "pattern," as are seen from the example of shrinking the lines in the embodiments described above. Thus, even with some changes in the dimensions of features or spacers, the transferred pattern, or patterns, is still considered to be the same pattern, or patterns, as the initial pattern. In contrast, forming spacers around mask features, e.g., the lines, may change the pattern.

CONCLUSION

Embodiments of the invention provide reverse pitch reduction flow enabling improved pattern transfer and the formation of differently sized features in conjunction with the use of pitch multiplication.

In methods according to embodiments of the invention, a sequence of layers of materials is formed that allow formation of a mask for processing a substrate to fabricate, for example, a memory chip or other integrated circuit device incorporating at least two regions on the active surface thereof having structural elements of substantially differing feature size. Thereafter, a first pattern of features is formed where conventional photolithography may be used to form the first pattern defining features in the mask, the features being generally formed in one region of the device, e.g., the peripheral region of the memory chip. Subsequently, a second pattern of spacers is formed using pitch multiplication. The second pattern of spacers form an element array in another region of the device, e.g., the memory array of the memory chip, advantageously eliminating acts conventionally required to form the spacers when subsequent features of various sizes are required to be formed therewith. The quality of the pattern of spacers may be improved and enhanced for subsequent transfer to the underlying substrate while potentially eliminating additional layering, cleaning, and etching acts otherwise conventionally required in order to form a device having respective features of diverse dimensions in the region of the memory array and in the peripheral region. The second pattern may completely or partially overlap the first pattern, or, in some embodiments, may be completely formed in different regions of the device, e.g., the periphery of the memory chip. The first pattern and the second pattern may be selectively covered by a protective mask and subjected to a so-called "loop chop" process to eliminate undesirable closed loops in order to obtain a modified pattern for transfer to the substrate. Optionally, a "loop chop" may be omitted during fabrication for a particular polarity of a level, thus saving an additional masking step.

Embodiments of the invention facilitate combining the patterns forming the differently sized spacers and features and successfully transferring the spacer and feature sizes and configurations to the underlying substrate while subjecting the spacers, with their size below the minimum pitch of the photolithographic technique used for patterning them, to fewer process acts which might compromise the quality of the transfer.

In further embodiments of the invention, the pattern of pitch-multiplied resolution spacers may be configured as an array.

While particular embodiments of the invention have been shown and described, numerous variations and other embodiments will occur to those of ordinary skill in the art. Accordingly, the invention is only limited in terms of the scope of the appended claims.

What is claimed is:

1. A method for device fabrication, comprising:
    forming a first mask over a semiconductor substrate;
    photolithographically forming a first pattern of features over the first mask, the features of the first pattern of features having a first width;
    forming a second pattern of features over the first mask using spacers formed by pitch multiplication subsequent to photolithographically forming the first pattern or features, features of the second pattern of features having a second width less than the first width;
    transferring the first pattern of features and the second pattern of features to the first mask;
    forming a second mask over the first pattern of features and the second pattern of features, leaving portions of the first pattern of features and the second pattern of features exposed; and
    etching the exposed portions of the first pattern of features and the second pattern of features to remove the exposed portions of the first pattern of features and the second pattern of features.

2. The method of claim 1, further comprising removing the second mask from the first pattern of features and the second pattern of features, and thereafter transferring the first pattern of features and the second pattern of features into the substrate.

3. The method of claim 1, wherein photolithographically forming the first pattern of features over the first mask comprises forming photoresist on the first mask and photolithographically forming the first pattern of features in the photoresist.

4. The method of claim 3, wherein photolithographically forming the first pattern of features over the first mask further comprises forming the first mask on a dielectric anti-reflective coating prior to photolithographically forming the first pattern of features in the photoresist and subsequently transferring the first pattern of features to the first mask.

5. The method of claim 4, wherein forming the first mask comprises depositing amorphous silicon, a silane oxide, a nitride or $Al_2O_3$ on the dielectric anti-reflecting coating.

6. The method of claim 4, wherein transferring the first pattern of features to the first mask comprises anisotropically etching the first mask and stopping the anisotropic etch at the dielectric anti-reflective coating.

7. The method of claim 4, further comprising removing the photoresist subsequent to transferring the first pattern of features to the first mask.

8. The method of claim 1, further comprising forming an etch stop on the first mask.

9. The method of claim 1, wherein forming the first mask over the semiconductor substrate comprises depositing amorphous carbon on the semiconductor substrate.

10. The method of claim 1, wherein forming the second pattern of features over the first mask using spacers formed by pitch multiplication subsequent to photolithographically forming the first pattern of features further comprises forming a plurality of lithographic features in a photoresist.

11. The method of claim 10, further comprising isotropically etching the plurality of lithographic features formed in the photoresist to form a plurality of modified features in the photoresist.

12. The method of claim 11, wherein isotropically etching the plurality of lithographic features formed in the photoresist to form a plurality of modified features formed in the photoresist comprises etching using a plasma.

13. The method of claim 11, further comprising conformally depositing a material over the plurality of modified features formed in the photoresist, the first mask, and the first pattern of features.

14. The method of claim 13, wherein conformally depositing a material over the plurality of modified features formed in the photoresist, the first mask, and the first pattern of features comprises depositing a silicon oxide.

15. The method of claim 13, further comprising anisotropically etching a portion of the material to expose a portion of the first mask between each of the modified features formed in the photoresist and the first pattern of features, wherein anisotropically etching a portion of the material comprises forming the spacers adjacent to each of the modified features formed in the photoresist.

16. A method for device fabrication, comprising:
    forming a first mask over a semiconductor substrate;
    forming an etch stop on the first mask;
    photolithographically forming a first pattern of features over the first mask, the features of the first pattern of features having a first width;
    forming a second pattern of features over, the first mask using spacers formed by pitch multiplication subsequent to photolithographically forming the first pattern of features, features of the second pattern of features having a second width less than the first width, the forming the second pattern of features comprising:
        forming a plurality of lithographic features in a photoresist;
        isotropically etching the plurality of lithographic features formed in the photoresist to form a plurality of modified features in the photoresist;
        conformally depositing a material over the plurality of modified features formed in the photoresist, the first mask, and the first pattern of features; and
        anisotropically etching a portion of the material to expose a portion of the first mask between each of the modified features formed in the photoresist and the first pattern of features, wherein anisotropically etching a portion of the material comprises forming the spacers adjacent to each of the modified features formed in the photoresist;
    transferring the first pattern of features and the second pattern of features to the first mask; and
    forming a second mask over the first pattern of features and the second pattern of features and leaving portions of at least the second pattern of features exposed.

17. The method of claim 16, wherein anisotropically etching a portion of the material comprises etching using a plasma etch or a reactive ion etch.

18. The method of claim 16, further comprising removing each of the lithographic features formed in the photoresist.

19. The method of claim 16, wherein forming a second mask over the first pattern of features and the second pattern of features comprises depositing a photoresist over the first pattern of features and the second pattern of features.

20. The method of claim 16, further comprising etching the exposed portions of at least the second features to remove the exposed portions of at least the second pattern of features and form a modified second pattern of features.

21. The method of claim 20, wherein forming a second mask over the first pattern of features and the second pattern of features further comprises exposing portions of the first pattern of features, and wherein etching the exposed portions of at least the second features further comprises removing the exposed portions of the first pattern of features.

22. The method of claim 20, wherein etching is by isotropically etching.

23. The method of claim 20, further comprising removing the second mask by anisotropically etching the second mask using a plasma.

24. The method of claim 23, further comprising transferring the modified second pattern of features and the first pattern of features into the first mask by anisotropically etching the first mask.

25. The method of claim 23, further comprising transferring the modified second pattern of features and the first pattern of features from the first mask into the semiconductor substrate.

* * * * *